(12) United States Patent
Ludwig

(10) Patent No.: US 8,816,263 B2
(45) Date of Patent: Aug. 26, 2014

(54) VIGNETTED PLANAR SPATIAL LIGHT-FIELD SENSOR AND SPATIAL SAMPLING DESIGNS FOR FAR-FIELD LENSLESS SYNTHETIC IMAGING VIA SIGNAL PROCESSING IMAGE FORMATION

(75) Inventor: Lester F. Ludwig, Redwood Shores, CA (US)

(73) Assignee: Lester F. Ludwig, San Antonio, TX (US)

(*) Notice: Subject to any disclaimer, the term of this patent is extended or adjusted under 35 U.S.C. 154(b) by 300 days.

(21) Appl. No.: 13/452,461

(22) Filed: Apr. 20, 2012

(65) Prior Publication Data

US 2012/0267512 A1  Oct. 25, 2012

Related U.S. Application Data

(60) Provisional application No. 61/517,454, filed on Apr. 20, 2011.

(51) Int. Cl.
*H01L 27/00* (2006.01)

(52) U.S. Cl.
USPC ........................................ 250/208.1; 250/239

(58) Field of Classification Search
USPC ............ 250/208.1, 239, 214.1, 216; 348/241, 348/335, 342–344; 359/621–626, 630–632
See application file for complete search history.

(56) References Cited

U.S. PATENT DOCUMENTS 6,751,025 B2 * 6/2004 Darrieux et al. .............. 359/630

* cited by examiner

*Primary Examiner* — Que T Le
(74) *Attorney, Agent, or Firm* — Procopio, Cory, Hargreaves & Savitch LLP

(57) ABSTRACT

Methods of implementing light field sensors for lensless synthetic imaging is provided. Relatively tall and short structures are fabricated, wherein the short structures comprise light sensing capabilities. The tall structures and short structures are arranged in an array to create an array of vignetted light sensors that partition an incoming light field into a plurality of vignetted light fields, each uniquely associated with a particular light sensor. Each light sensor generates a measurable electrical quantity responsive to the associated vignetted light field, and the collective measurable electrical quantities are responsive to incoming light field. The short structures can comprise photodiodes, LEDs, or OLEDs, and the resulting light field sensor can respond to color. Tall structures can comprise electronic components, LEDs, OLEDS, or OLETs. In an example implementation, tall structures in the array are light-emitting and act as a light-emitting visual display which further comprises an array of vignetted light sensors.

20 Claims, 21 Drawing Sheets

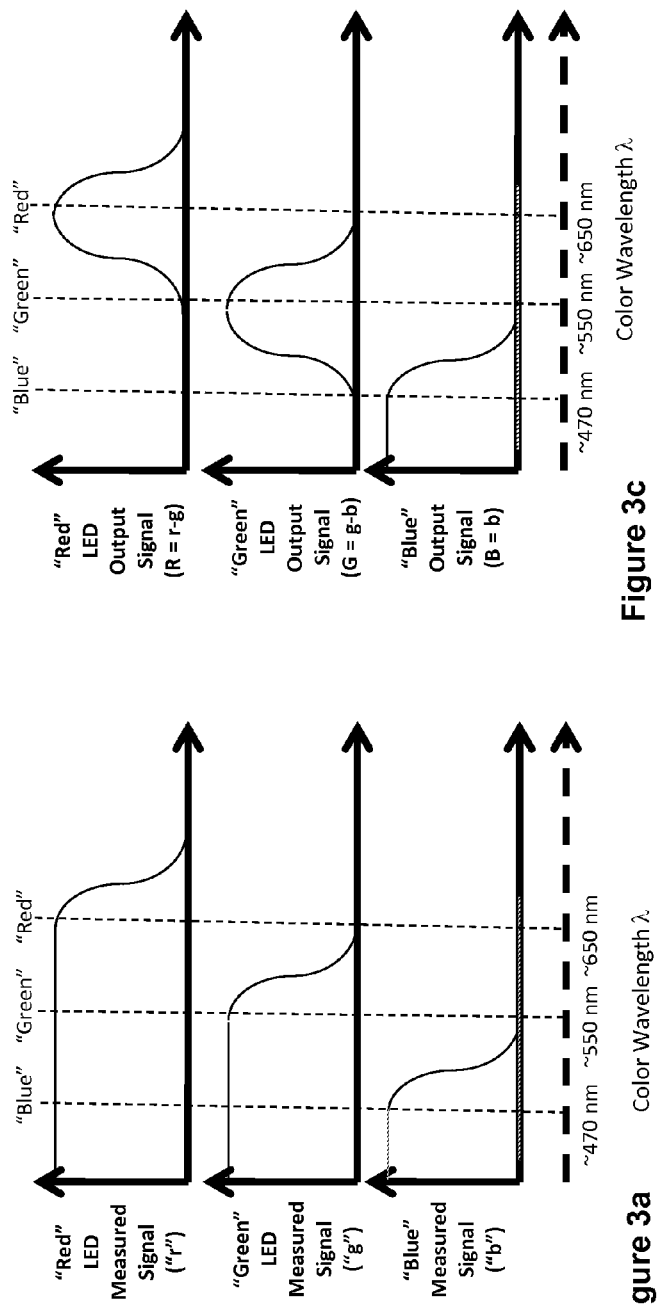
Figure 3a
Figure 3c
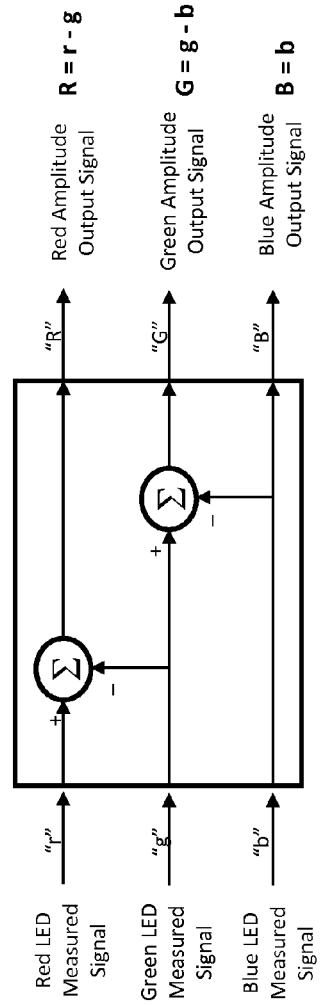
Figure 3b

VIGNETTED PLANAR SPATIAL LIGHT-FIELD SENSOR AND SPATIAL SAMPLING DESIGNS FOR FAR-FIELD LENSLESS SYNTHETIC IMAGING VIA SIGNAL PROCESSING IMAGE FORMATION

CROSS-REFERENCE TO RELATED APPLICATION

This regular utility U.S. patent application is based on and claims the benefit of priority under 35 U.S.C. 119 from provisional U.S. patent application No. 61/517,454, filed on Apr. 20, 2011, the entire disclosure of which is incorporated by reference herein.

COPYRIGHT & TRADEMARK NOTICES

Certain marks referenced herein may be common law or registered trademarks of the applicant, the assignee or third parties affiliated or unaffiliated with the applicant or the assignee. Use of these marks is for providing an enabling disclosure by way of example and shall not be construed to exclusively limit the scope of the disclosed subject matter to material associated with such marks.

BACKGROUND OF THE INVENTION

1. Field of the Invention

This invention pertains to electronic image formation and refinement from overlapping measurement vignettes captured by an array of image sensors and associated vignetting micro-optics. The present invention is directed in major part to an alternate image formation system that combines readily-fabricated micro-optical structures, a two-dimensional image sensor array with electronic or digital image processing to actually construct the image.

2. Discussion of the Related Art

Systems and methods for "lensless" synthetic image formation performed in signal processing from light field sensors have been developed in a series of issued patents and pending patent applications including:

U.S. Pat. No. 8,125,559;
CA 2,318,395
PCT/US99/01789;
U.S. Ser. No. 12/419,229;
U.S. Ser. No. 12/828,280;
U.S. Ser. No. 12/828,171;
U.S. Ser. No. 12/828,207;
U.S. Ser. No. 12/828,228;
U.S. Ser. No. 13/072,588;
U.S. Ser. No. 13/180,345.

In these, synthetic image formation algorithms and methods robust to variations in light-field sensor element characteristics are taught. Image formation is obtained via signal processing operations rather than purely optical processes such as lens-based or pin-hole imaging. Additionally, robustness to variations in light-field sensor element characteristics significantly eases the precision requirements and manufacturing variation tolerances, variations due to aging, thermal expansion, moderate physical shock, etc. Further, the use of LED arrays as both image sensors and image displays, including color capabilities, are also taught.

The Present Invention

In this context, the present invention is directed to spatial aspects of light-field sensors, spatial signal design, spatial sub-sampling, and real-time computation for use with the systems and methods in the afore-listed patents and pending patent applications and other uses. Consideration is given to cases where the degree of sensor vignette capture overlap is very high, including cases at sensor-to-object separation distances where every, or nearly-every, sensor has at least some vignette capture overlap with the vignette capture of every, or nearly-every, other sensor. These conditions can occur, for example, for implementations employing planar image sensor arrays wherein The planar image sensor arrays has high spatial resolution;
The vignette-based imaging is of a relatively far-field object;
Both of the above at once.

Examples of interest include, for example, the use of a color LED (Light-Emitting Diode), color OLED (Light-Emitting Diode) display, color OLET (Light-Emitting Transistor) display, etc. for example in the form of a consumer television, and its use as an image sensor (for example, in professional and/or home video conferencing).

SUMMARY OF THE INVENTION

For purposes of summarizing, certain aspects, advantages, and novel features are described herein. Not all such advantages may be achieved in accordance with any one particular embodiment. Thus, the disclosed subject matter may be embodied or carried out in a manner that achieves or optimizes one advantage or group of advantages without achieving all advantages as may be taught or suggested herein.

In an aspect of the invention, relatively "tall" structures (which in some implementations can be light-emitting) and relatively "short" light-sensing structures can be fabricated in various types of arrays to create arrays of vignetted light sensors, the vignetted light sensors comprising a vignette depth resulting from the difference in height between the relatively "tall" structures and relatively "short" light-sensing structures.

In an aspect of the invention, a method for implementing light field sensor for use in lensless synthetic imaging is provided comprising:

Fabrication relatively tall structures and short structures, wherein the short structures comprise light sensing capabilities, and wherein the tall structures and short structures are arranged in an array to create an array comprising a plurality of vignetted light sensors, and Receiving an incoming light field, Partitioning the incoming light with the tall structures to created a plurality of vignetted light fields, each vignetted light field uniquely associated with a particular vignetted light sensor from the plurality of vignetted light sensors, Receiving each vignetted light field at the associated each vignetted light sensor, and Generating, at each vignetted light sensor, a measurable electrical quantity responsive to the associated vignetted light field, wherein the vignetted light sensors comprising a vignette depth resulting from the difference in height between the tall structures and short light-sensing structures, and wherein the collection of the electrical quantities from each of the vignetted light sensors is responsive to the received incoming light field.

In an aspect of the invention, the "short" light-sensing structures can comprise organic photodiodes, OLEDs, or similar kinds of devices comprised of at least organic semiconducting material.

In an aspect of the invention, the "tall" structure can comprise light-emitting elements.

In an aspect of the invention, the "tall" structure can comprise can comprise one or more LEDs.

In an aspect of the invention, the "tall" structure can comprise can comprise one or more OLEDs.

In an aspect of the invention, the "tall" structure can comprise can comprise one or more OLETs.

In an aspect of the invention, the "tall" structure can be a structure that does not emit light, In an aspect of the invention, the "tall" structure can be a structure that does not emit light and comprise one or more electronic devices.

In an aspect of the invention, the "tall" structure can be a structure that does not emit light and is non-electrical.

In an aspect of the invention, staggered spatial decimation (sub-sampling) is used to reduce the number of measurement values involved in image formation calculations.

In an aspect of the invention, the structures and their performance characterizations and tradeoffs as described thus far can be used to create various engineering designs for image capture.

In an aspect of the invention, from, fixed values and/or ranges of values of some of the design parameters p, d, L, and s, as well as other derived quantities such as % overlap and spatial sub-sampling design parameters (for example, as described below), can be used to determine fixed values and/or ranges of values of the remaining design parameters and other derived quantities.

In an aspect of the invention, from a provided pixel width (corresponding to "pitch" and resolution on a display), a given desired range of separation distances, and a given screen size, associated vignette depths and % overlaps can be calculated.

In an aspect of the invention, the % overlap quantity is used in spatial sub-sampling design.

In another aspect of the invention, from a provided pixel width (corresponding to "pitch" and resolution on a display), a given screen size, and a practical range of inexpensively and reliably fabricated vignette depths, a resulting range of separation distances and % overlaps can be calculated.

In another aspect of the invention, from a maximum permitted % overlap, and other values or ranges for some of the design parameters p, d, L, and s, values or ranges for the remaining design parameters can be calculated.

In another aspect of the invention, where ranges of values of some of the design parameters p, d, L, and s, as well as other derived quantities such as % overlap and spatial sub-sampling design parameters are provided, ranges of values of the remaining design parameters and other derived quantities can be obtained employing formal Interval Analysis methods for calculation.

In another aspect of the invention, where ranges of values of some of the design parameters p, d, L, and s, as well as other derived quantities such as % overlap and spatial sub-sampling design parameters are provided, ranges of values of the remaining design parameters and other derived quantities can be obtained employing formal Interval Analysis methods for optimization.

In another aspect of the invention, algorithm implementations are provided for modeling optical aspects of the above and related types of analysis.

In another aspect of the invention, algorithm implementations are provided for mathematical analysis of optical aspects of the above and related types of analysis.

In another aspect of the invention, algorithm implementations are provided for interactive visualization modeling of optical aspects of the above and related types of analysis.

In another aspect of the invention, a color LED (Light-Emitting Diode) array is used as an image sensor.

In another aspect of the invention, a color LED (Light-Emitting Diode) display, for example in the form of a consumer television, is used as an image sensor.

In another aspect of the invention, a color OLED (Light-Emitting Diode) array is used as an image sensor.

In another aspect of the invention, a color OLED (Light-Emitting Diode) display, for example in the form of a consumer television, is used as an image sensor.

In another aspect of the invention, a color OLET (Light-Emitting Transistor) array is used as an image sensor.

In another aspect of the invention, a color OLET (Light-Emitting Transistor) display, etc. for example in the form of a consumer television, is used as an image sensor.

In another aspect of the invention, the resulting arrangement is used to capture the image of a relatively far-field object.

In another aspect of the invention, the resulting arrangement is used as part of a video conferencing system.

BRIEF DESCRIPTION OF THE DRAWINGS

The previous and subsequent aspects, features and advantages of the present invention will become more apparent upon consideration of the following description of preferred embodiments taken in conjunction with the accompanying drawing figures. The accompanying figures are examples of the various aspects and features of the present invention and are not limiting either individually or in combination.

FIGS. 3a-3e depict color imaging approaches leveraging LED and OLED arrays as a color light field sensor as taught in U.S. Pat. No. 8,125,559 and pending patent applications U.S. Ser. Nos. 12/828,171; 12/828,207; 12/828,228; 13/072,588; and 13/180,345.

DETAILED DESCRIPTION

Figure 1A:
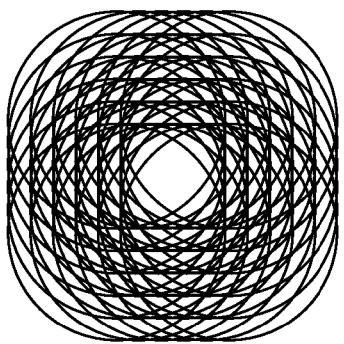
FIGS. 1a-1d depict increasing degrees of overlap as the separation between a planar vignetted sensor array and an object plane increases.
Figure 1B:
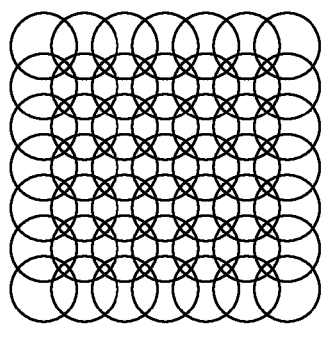
Figure 1C:
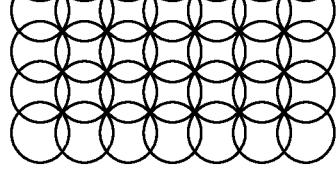
Figure 1D:
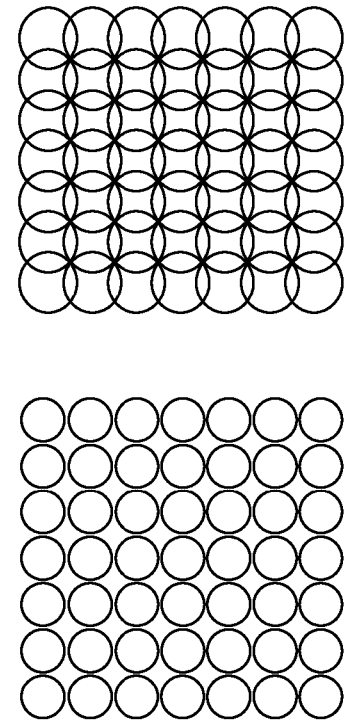

In the following, numerous specific details are set forth to provide a thorough description of various embodiments. Certain embodiments may be practiced without these specific details or with some variations in detail. In some instances, certain features are described in less detail so as not to obscure other aspects. The level of detail associated with each of the elements or features should not be construed to qualify the novelty or importance of one feature over the others.

In the following description, reference is made to the accompanying drawing figures which form a part hereof, and which show by way of illustration specific embodiments of the invention. It is to be understood by those of ordinary skill in this technological field that other embodiments can be utilized, and structural, electrical, as well as procedural changes can be made without departing from the scope of the present invention. The aspects and features described herein can be used singly or in combination unless specifically stated otherwise.

Furthermore, in the figures, it is to be understood that emphasis has been placed on depicting functionality, structure, and methods regarding many aspects of the invention. In choosing this emphasis, little treatment of aesthetics and visual appeal has been included. It is to be understood that a number of additional techniques of encasement, overlay bezel, alternate structure, ornamental embellishment, etc. can be used to obtain a wide range of aesthetic value and effect.

As mentioned in the introduction, systems and methods for "lensless" synthetic image formation performed in signal processing from light field sensors have been developed in issued patents including U.S. Pat. No. 8,125,559, CA 2,318, 395, and completed PCT/US99/01789, as well as in pending patent applications U.S. Ser. Nos. 12/419,229; 12/828,280; 12/828,171; 12/828,207; 12/828,228; 13/072,588; 13/180, 345. A brief overview description is that material is provided below.

As considered in the aforementioned patents and patent applications, vignetted light sensors can be used to create synthetic images via algebraic operations. The algebraic operations, which can comprises for example a predetermined generalized-inverse operation responsive to a Depth-of-Field parameter. The generalized-inverse operation (for example, a Moore-Penrose generalized-inverse) is used to recover estimated pixel light amplitude at a particular distance from the vignetted light sensor surface. The generalized-inverse operation effectively solves an (over-specified) set of M equations for a "best fit" of N unknowns, with integers M>N (more equations than unknowns). The "best fit" (for example, in a "least-squares" sense for the Moore-Penrose generalized-inverse) provides robustness against deviant measurements as can arise from manufacturing variations, variations due to aging, thermal expansion, moderate physical shock, etc.

FIGS. 1a-1d depict increasing degrees of overlap as the separation between a planar vignetted sensor array and an object plane increases. As the overlap increases, the generalized-inverse operation has to "work harder" to recover the estimated pixel light amplitude values from the measurements, and is more susceptible to noise errors, computational rounding errors, etc. At one extreme of operating range of separation distance (FIG. 1a), there is no overlap and the generalized-inverse operation is effectively a trivial identity operation (albeit with less of the aforementioned robustness features). At the opposite extreme of operating range of separation distance (FIG. 1d), there is nearly 100% overlap and the generalized-inverse operation has to (numerically) work extremely hard to create the estimated pixel light amplitude values from the measurements and can be vulnerable to noise errors, computational rounding errors, etc.

Figure 2:
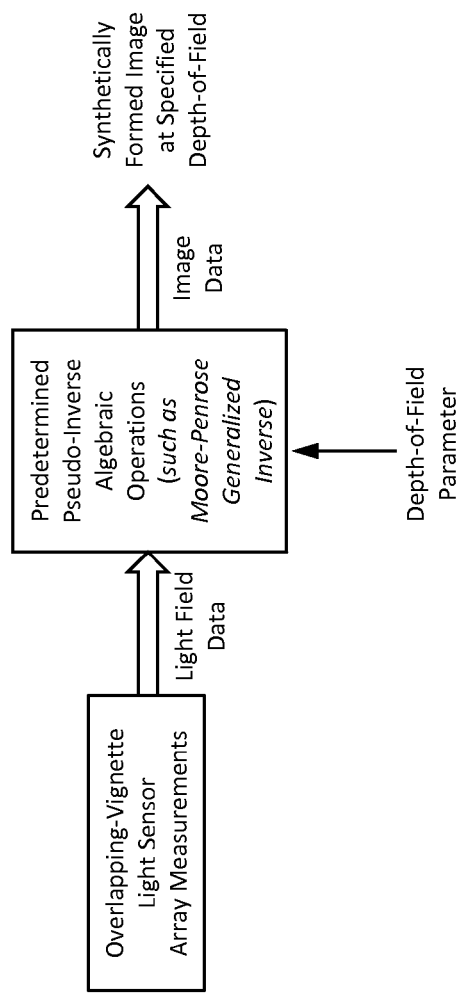
FIG. 2 depicts a high-level overview of synthetic image formation from overlapping-vignette light sensor array measurements as taught in issued patents U.S. Pat. No. 8,125,559 and CA 2,318,395 and pending patent applications U.S. Ser. Nos. 12/419,229; 12/828,280; 12/828,171; 12/828,207; 12/828,228; 13/072,588; and 13/180,345.
Figures 3D, 3E:
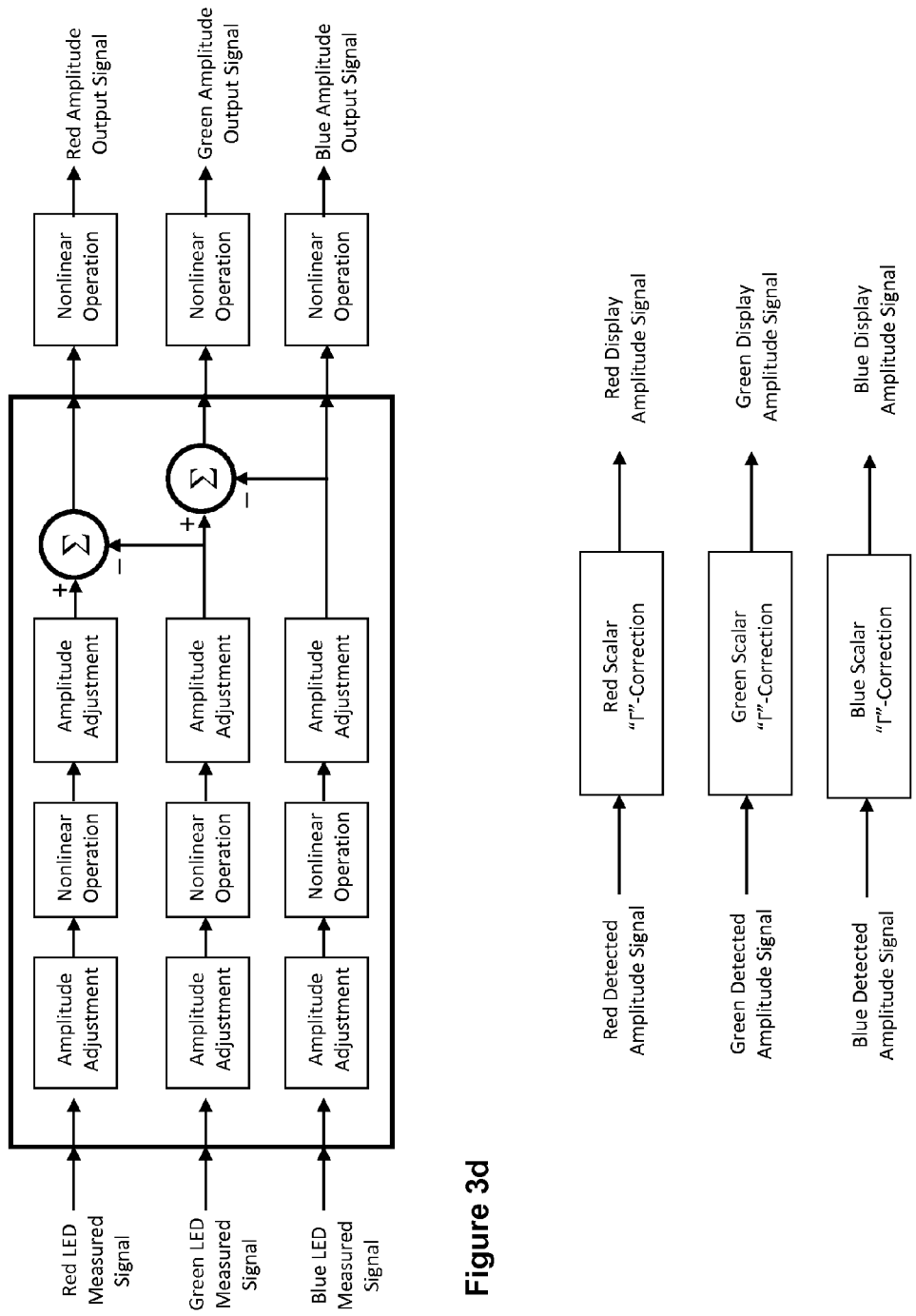

FIG. 2 depicts a high-level overview of synthetic image formation from overlapping-vignette light sensor array measurements, leveraging the above, as taught in issued patents U.S. Pat. No. 8,125,559 and CA 2,318,395 and pending patent applications U.S. Ser. Nos. 12/419,229; 12/828,280; 12/828,171; 12/828,207; 12/828,228; 13/072,588; and 13/180,345.

The approach described can be used for monochrome and color imaging. In particular, FIGS. 3a-3e depict color imaging approaches leveraging LED and OLED arrays as a color light field sensor as taught in U.S. Pat. No. 8,125,559 and pending patent applications U.S. Ser. Nos. 12/828,171; 12/828,207; 12/828,228; 13/072,588; and 13/180,345.

Figure 4:
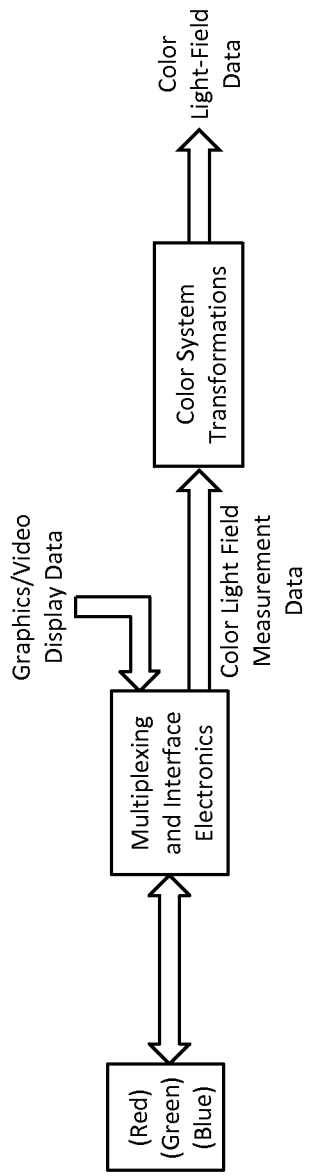
FIG. 4 depicts additional color imaging approaches leveraging LED and OLED arrays as both a color display and a color light field sensor as taught in U.S. Pat. No. 8,125,559 and pending patent applications U.S. Ser. Nos. 12/828,171; 12/828,207; 12/828,228; 13/072,588; and 13/180,345.

Further, the LED or OLED imaging approach described can be multiplexed (temporally, spatially, or in combination) with a LED or OLED display mode, and as such a LED or OLED can serve as both a color display and a color light field sensor. In particular, FIG. 4 depicts additional color imaging approaches leveraging LED and OLED arrays as both a color display and a color light field sensor as taught in U.S. Pat. No. 8,125,559 and pending patent applications U.S. Ser. Nos. 12/828,171; 12/828,207; 12/828,228; 13/072,588; and 13/180,345.

Having reviewed the basic technology underlying the present invention, the remainder of the Detailed Description is organized as follows:

First, light-field sensor arrangements compatible with visual display monitors (such as can be used with home television displays, video conferencing systems, computer monitors, smart phones, laptop computers, computer tablets, and other devices) are briefly considered;

Next a general geometric framework is assembled for calculating the size and span of the sensor vignettes as a function of vignetting structure parameters and the separation distance between the visual display screen and imaged object;

Then the image capture region (of the width or the height of the visual display screen) as a function of these parameters and the visual display screen dimension (width or height);

Using a related calculation, the degree of sensor vignetting overlap can be calculated;

For parameter ranges pertaining to regions viable for example use in home television viewing areas or video conferencing rooms, examples are given where the degree of sensor vignette overlap is determined to be high enough to not impose resolution degradation and also high enough to support spatial sub-sampling;

Spatial sub-sampling is then considered;

Consideration is then directed to calculation-imposed quantization noise and the available dynamic range above the noise floor for various levels of signal processing arithmetic accuracy;

Consideration is also directed to the computational load captured image resolution;

Some examples are provided;

Example mathematical analysis and interactive visualization software to assist in design and research is then described.

Creation of Vignette Structures for Light Detection within Displays or Other Fabricated Surfaces In this section, the creation of vignetted light sensors by interleaving "short" light-sensing structures among taller structures, including tall light-emitting structures is considered. Of interest is use of such arrangements in structuring the viewing surface of a color LED or OLED display, for example in the form of a consumer television. Other approaches can also be used with consumer television displays, including LCD displays; a number of these (for example, the use of transparent OLED overlays) are taught in pending patent applications U.S. Ser. Nos. 13/072,588 and 13/180,345.

Figure 5:
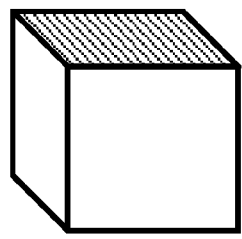
FIGS. 5 and 6 depict respectively example relative "tall" structures (which in some implementations can be light-emitting) and relative "short" light-sensing structures.
Figure 6:
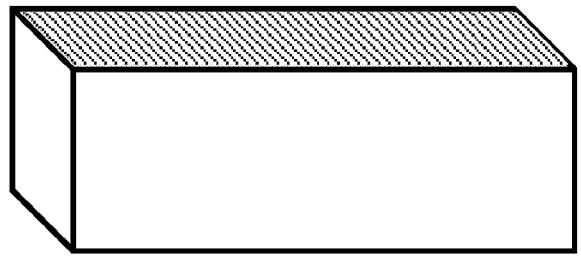

FIGS. 5 and 6 depict respectively example relative "tall" structures (which in some implementations can be light-emitting) and relative "short" light-sensing structures. Such structures can internally comprise a plurality of layers and can accordingly be fabricated by traditional semiconductor photolithography fabrication techniques, functional printing fabrication techniques, etc.

In an approach, the "short" light-sensing structures can comprise organic photodiodes, OLEDs, or similar kinds of devices comprised of at least organic semiconducting material.

In an example approach the "tall" structure can comprise light-emitting and can comprise one or more OLEDs.

In another example approach, the "tall" structure can comprise can comprise one or more LEDs.

In another example approach, the "tall" structure can comprise can comprise one or more OLEDs.

In another example approach, the "tall" structure can comprise can comprise one or more OLETs.

In another example approach, the "tall" structure can be a structure that does not emit light, In another example approach, the "tall" structure does not emit light.

In another example approach, the "tall" structure comprises one or more electronic devices. For example, the one or more electronic devices can include one or more of a driving transistor, a sensor interface transistor, and a multiplexing transistor.

In another example approach, the "tall" structure can be a structure that does not emit light and is non-electrical.

Figure 8:
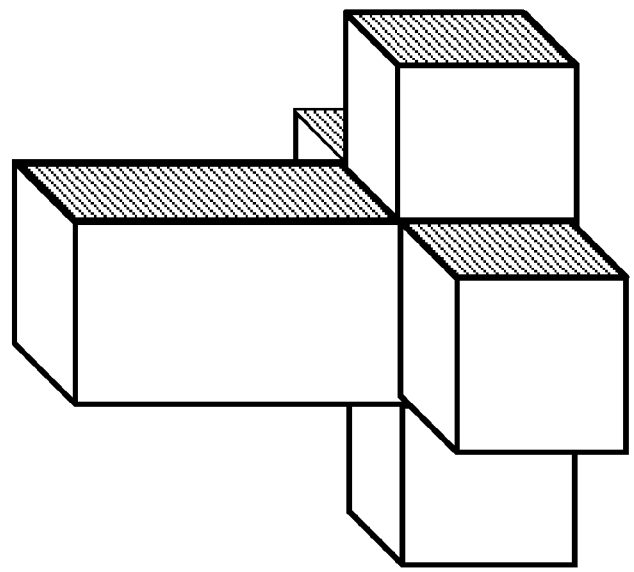
FIG. 8 depicts the arrangement of FIG. 7 wherein the four "short" light-sensing structures are fabricated in a ring surrounding "tall" structure (which in some implementations can be light-emitting).
Figure 7:
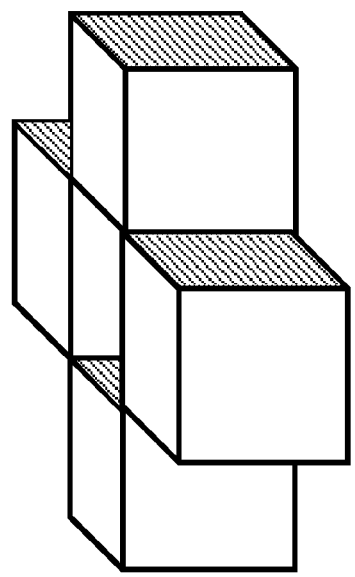
FIG. 7 depicts four "short" light-sensing structures arranged in an open-interior ring formation.
Figure 9:
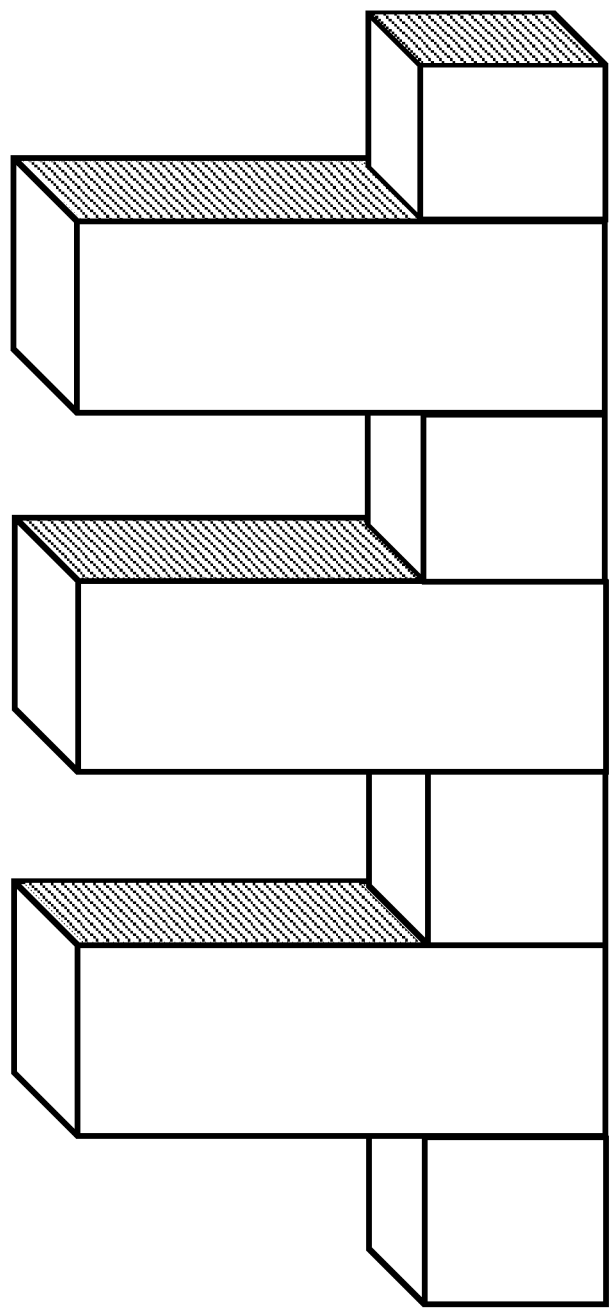
FIG. 9 depicts a linear arrangement of alternating short" light-sensing structures and "tall" structures (which in some implementations can be light-emitting).
Figure 10:
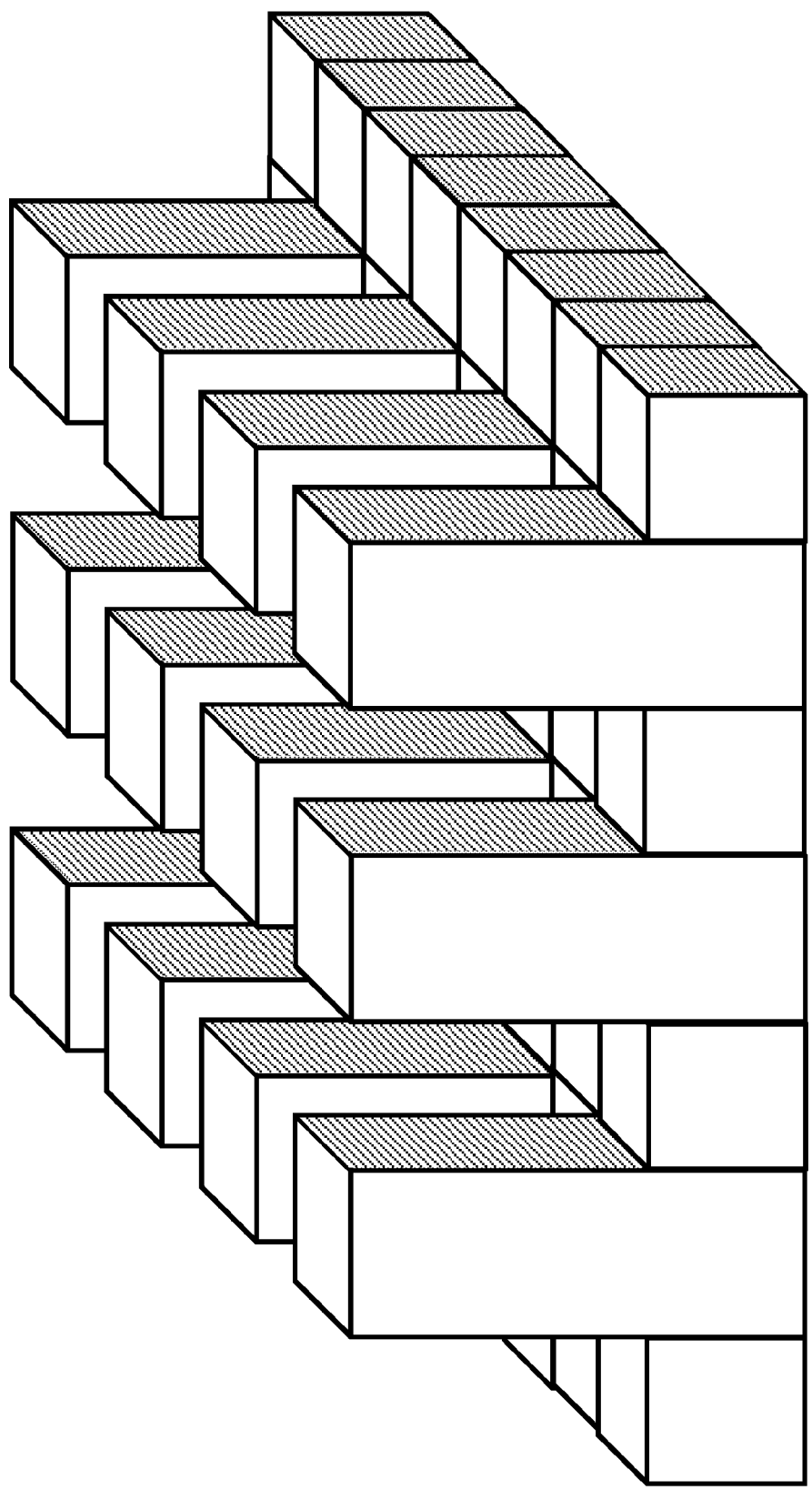
FIG. 10 depicts a plurality of parallel-oriented instances of the linear arrangement of FIG. 9, each parallel-oriented instance separated by a linear arrangement comprising only "short" light-sensing structures.
Figure 11A:
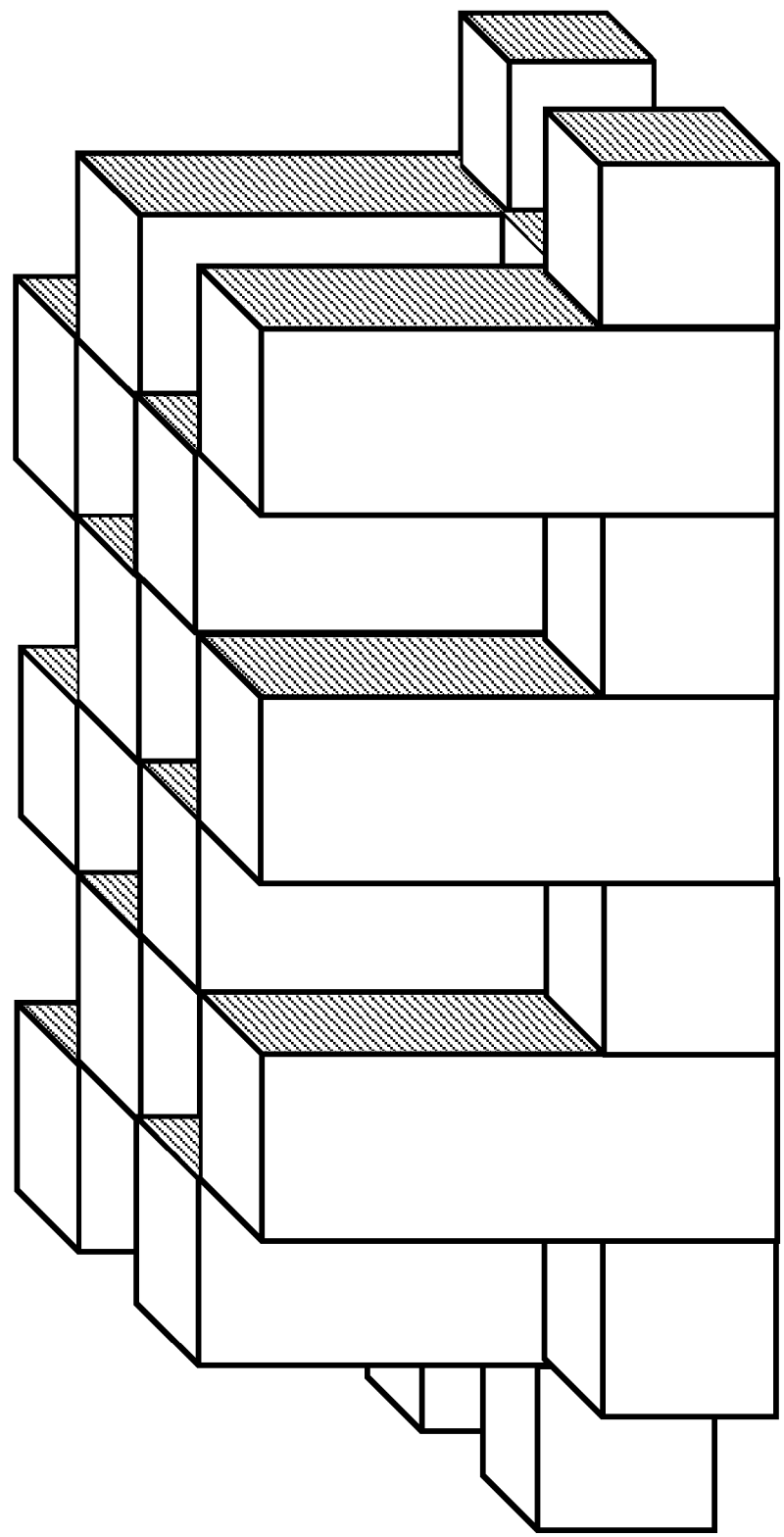
FIG. 11a depicts a plurality of only parallel-oriented instances of the linear arrangement of FIG. 9, each parallel-oriented instance alternately staggered so as to create cavities surrounded on all sides by "tall" structures (which in some implementations can be light-emitting), the bottom of each cavity comprising a "short" light-sensing structure.

Such relatively "tall" structures (which in some implementations can be light-emitting) and relatively "short" light-sensing structures can be fabricated in various types of arrays comprising adjacent or near-adjacent placement of the structures. For example:

FIG. 7 depicts four "short" light-sensing structures arranged in an open-interior ring formation;

FIG. 8 depicts the arrangement of FIG. 7 wherein the four "short" light-sensing structures are fabricated in a ring surrounding "tall" structure (which in some implementations can be light-emitting);

FIG. 9 depicts a linear arrangement of alternating short" light-sensing structures and "tall" structures (which in some implementations can be light-emitting);

FIG. 10 depicts a plurality of parallel-oriented instances of the linear arrangement of FIG. 9, each parallel-oriented instance separated by a linear arrangement comprising only "short" light-sensing structures;

FIG. 11a depicts a plurality of only parallel-oriented instances of the linear arrangement of FIG. 9, each parallel-oriented instance alternately staggered so as to create cavities surrounded on all sides by "tall" structures (which in some implementations can be light-emitting), the bottom of each cavity comprising a "short" light-sensing structure.

Figure 11B:
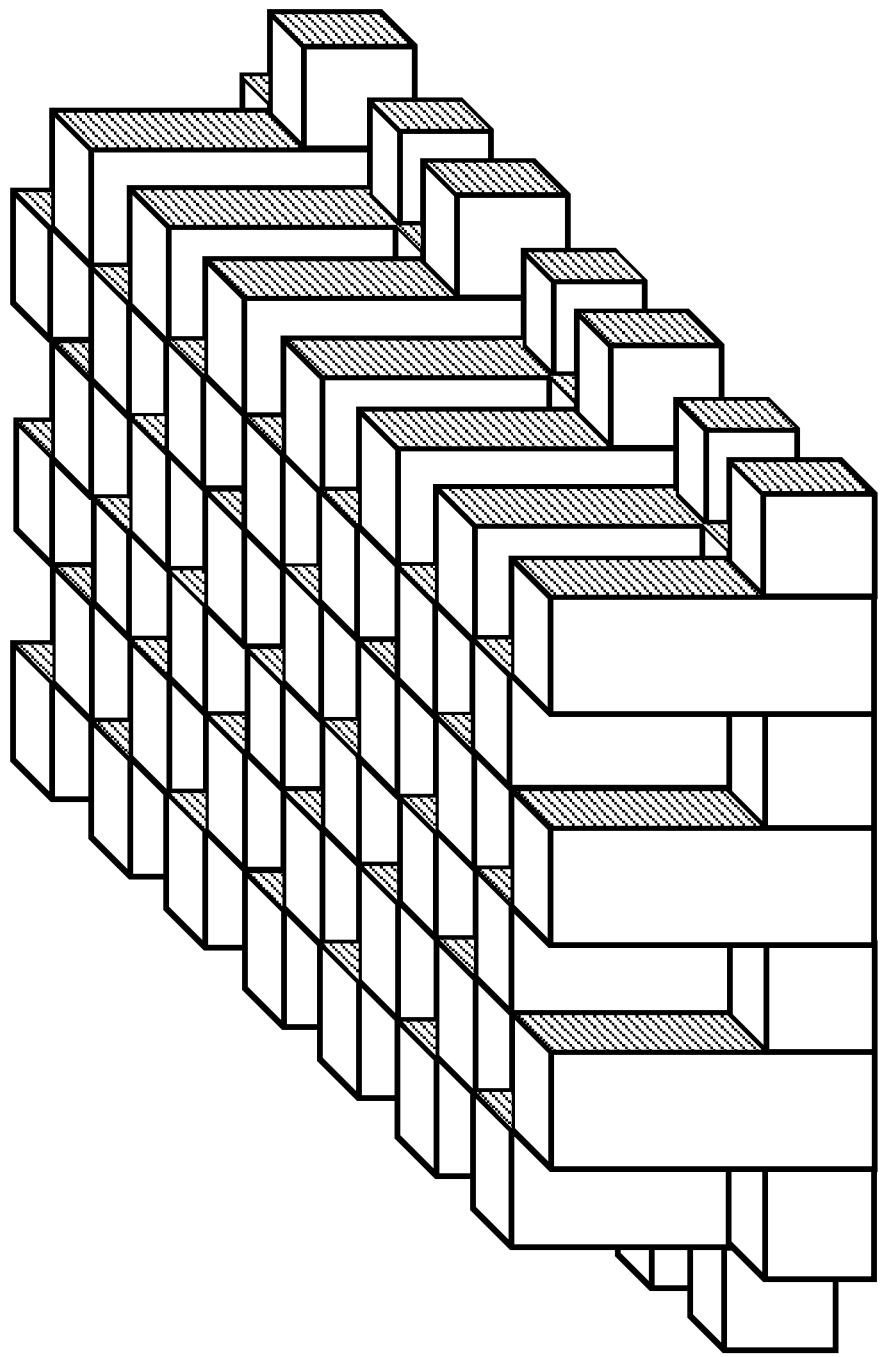
FIG. 11b depicts the example pattern of FIG. 11a extended to an example of larger-scale replication.

Of interest are patterns such as that rendered in arrangements such as that of FIG. 11a, i.e., pattern comprising cavities surrounded on all sides by "tall" structures (which in some implementations can be light-emitting), the bottom of each cavity comprising one or more "short" light-sensing structures. Arrangements comprising such patterns implement light-sensing structures that present the surface of a light-sensing element at the bottom of a vignetting structure. If the bases of the "short" light-sensing structures and the "tall" structures (which in some implementations can be light-emitting) are positioned at the same level, then the depth of the vignetting structure is the difference in "height" between the "short" light-sensing structures and the "tall" structures (which in some implementations can be light-emitting). The pattern of FIG. 11a can ready be extended to larger-scale replication as suggested in FIG. 11b.

In an example implementation, relatively "tall" structures (which in some implementations can be light-emitting) and relatively "short" light-sensing structures can be fabricated in various types of arrays to create arrays of vignetted light sensors, the vignetted comprising a vignette depth resulting from the difference in height between the relatively "tall" structures and relatively "short" light-sensing structures.

In an example implementation, the "tall" structures comprise light-emitting elements, and the array of "tall" structures collectively act as a light-emitting visual display further comprising an array of vignetted light sensors, each vignetted light sensor comprising at least one "short" structure. Further, electronic circuitry interfacing and/or driving the light-emitting elements can be configured in various types of multiplexed array arrangements configured for multiplexing operation.

In an example implementation, each vignetted light sensor provides a measurable electrical quantity responsive to the light it receives from incoming light not occluded by the vignette. For example, as taught in U.S. Pat. No. 8,125,559 and pending patent applications U.S. Ser. Nos. 12/828,171; 12/828,207; 12/828,228; 13/072,588; and 13/180,345, the measurable electrical quantity can comprise a photocurrent, a photovoltage, or a photo-induced charge, each of which can be converted responsively into an electrical signal by simple electronic circuitry. Further, such electronic circuitry can be configured in a multiplexed array.

Figure 12:
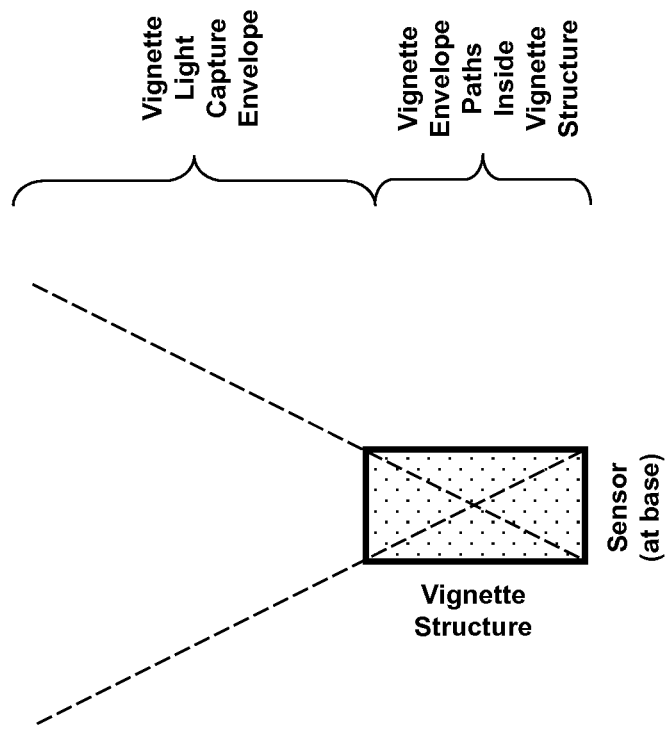
FIG. 12 depicts how a vignette structure can limit the range of incident angles at which rays of light within a light field are able to reach the surface of the light-sensing element within the vignetting structure.

Each vignette structure can limit the range of incident angles at which rays of light within a light field are able to reach the surface of the light-sensing element within the vignetting structure. This is illustrated in FIG. 12. Here the dashed lines denote light ray paths at limiting angles via which the rays can travel to the light sensor positioned at the base of the depicted vignetting structure. Outside the vignetting structure the light capture range expands as a linear (affine, i.e., proportional term plus offset term) function of the distance from the surface of the sensor. Note the extremal light rays defining the span of light capture intersect begin at a depth halfway down the vignetting structure path, more precisely halfway between the opening of the vignette and the surface of the light sensor at the base of the vignetting structure.

In some embodiments, the arrangements can be fabricated so that the sides of the vignetting structure cavity do not reflect light. In other embodiments, the arrangements can be fabricated so that the sides of the vignetting structure cavity do advantageously reflect light. The reflectivity can alter the range of incident angles at which rays of light within a light field are able to reach the surface of the light-sensing element within the vignetting structure. Typically, for incoherent light (wherein there are no possible cancellation effects due to mixtures of light phase) a reflective vignetting structure interior would broaden the light capture range with respect to what the light capture range would be with a non-reflective vignetting structure interior. This is because light that would not otherwise be able to travel to the sensor directly would reflect from the walls of the vignetting structure interior one or more times, and typically at least some portion, and in some arrangements a significant amount, of this reflected light would travel to the sensor.

Figure 13:
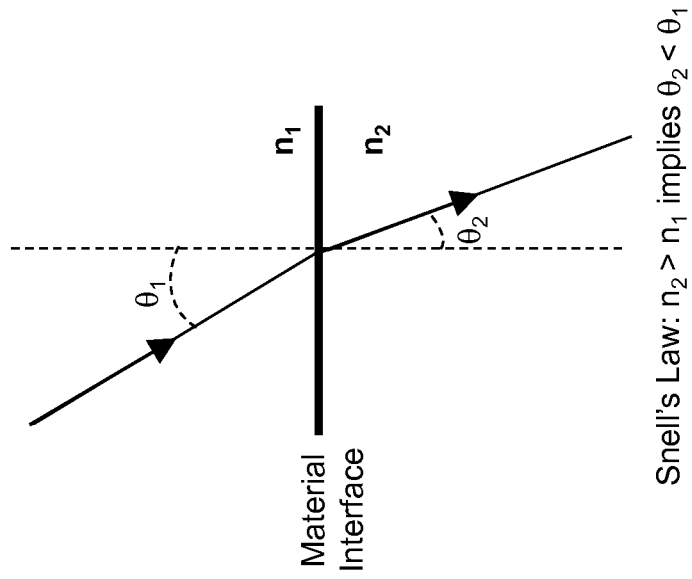
FIG. 13 depicts a representation of the refractive effect (governed by Snell's law) that is created at the interface between two materials with differing indices of refraction in the usual fashion it which it is described in textbooks.

Another method of broadening the vignette span is to leverage the Snell's law refractive effect created at the interface between two materials with differing indices of refraction. This is effect is depicted in FIG. 13 in the usual fashion it which it is described in textbooks (i.e., light travelling from air or vacuum into the surface of a material such as glass or water.

Figure 15A:
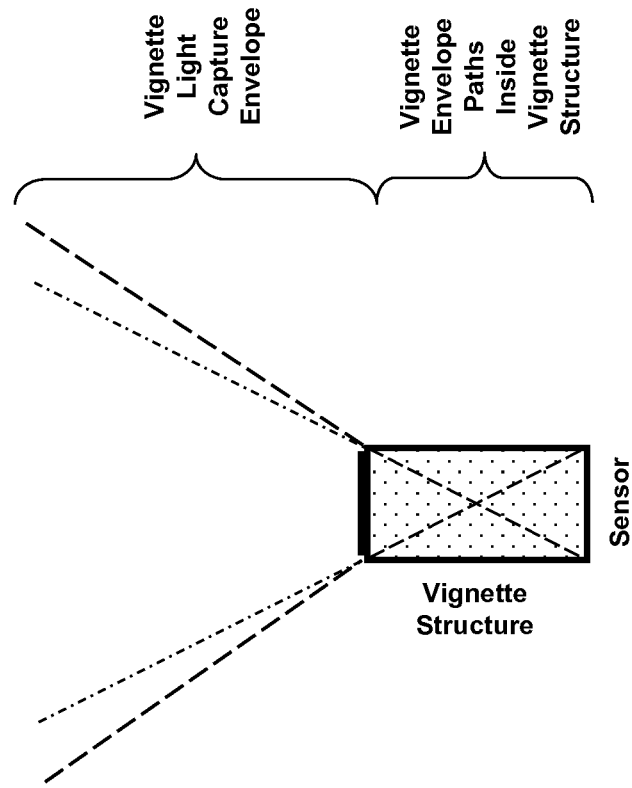
FIG. 15a depicts an interface between pairs of materials with differing indices of refraction can be implemented at the top of the vignetting structure.
Figure 15B:
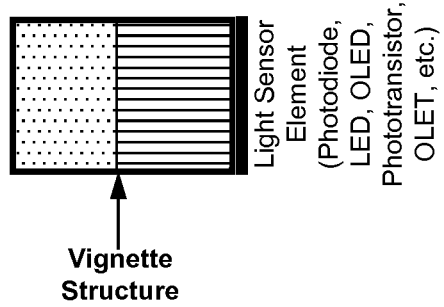
FIG. 15b depicts an interface between pairs of materials with differing indices of refraction can be implemented both within and at the top of the vignetting structure.

Thus by appropriate choices of paired optical materials and their positions, the light ray paths depicted in FIG. 12 can be bent in angles prescribed by Snell's law. In one approach, such an interface between air and one or more layers of materials with differing indices of refraction can be implemented at least in part at the top of the vignetting structure. The simplest case of this is filing the entire vignetting structure with a single material having an index of refraction significantly differing from that of air, for example as depicted in FIG. 15a. In a multiple-layer embodiment leveraging this approach, adjoining pairs of materials can be entirely localized at the top of the vignetting structure. In another multiple-layer embodiment of this approach, the interface between one or more pairs of materials with differing indices of refraction can be implemented within the vignetting structure, for example as in the single-pair structure depicted in FIG. 15b.

Using this approach, the capture range can be broadened with respect to how it would occur in the arrangement of FIG. 12; here the capture range broadening for the sensor and vignette structure is accomplished without the use of reflective surfaces within the interior of the vignette structure.

Figure 14:
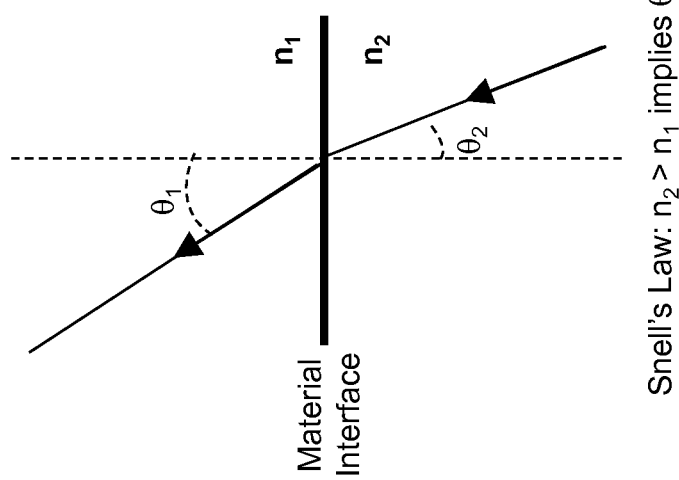
FIG. 14 depicts the relation of FIG. 13 with light traveling in the opposite direction showing light rays will travel along the same path as in FIG. 13.

It is noted that this relation is reciprocal and light traveling in the opposite direction will travel along the same path (see for example "The reversibility of light" in J. Avison, *The World of Physics*, Second revised edition, Thomas Nelson and Sons Ltd. Publishers, Cheltenham, 1989, ISBN 0-17-438733-4, page 24) as depicted in FIG. 14. Thus if the light sensor also serves a light emitting function (for example, using a LED or OLED as a multiplexed light emitter and light sensor as taught in U.S. Pat. No. 8,125,559 and pending U.S. patent application Ser. Nos. 12/828,280 and 12/419,229, including color capabilities), the emitted light beam envelope will also broaden.

For many applications a narrowing of the capture range can be of interest since any such narrowing reduces the extent of overlap as the separation distance between the sensor array and object increases to integer multiples of the width and/or height of sensor array. As will be seen, attempts to attain a narrowing of the capture range simply from adjustment of the depth of the vignetting structures tends to require deeper vignettes, and increasingly deeper vignetting structures can become increasingly difficult to fabricate at a given level of precision.

In an example implementation, a method for implementing light field sensor for use in lensless synthetic imaging is provided comprising:

Fabrication relatively tall structures and short structures, wherein the short structures comprise light sensing capabilities, and wherein the tall structures and short structures are arranged in an array to create an array comprising a plurality of vignetted light sensors, and Receiving an incoming light field, Partitioning the incoming light field with the tall structures to created a plurality of vignetted light fields, each vignetted light field uniquely associated with a particular vignetted light sensor from the plurality of vignetted light sensors, Receiving each vignetted light field at the associated each vignetted light sensor, and Generating, at each vignetted light sensor, a measurable electrical quantity responsive to the associated vignetted light field, wherein the vignetted light sensors comprising a vignette depth resulting from the difference in height between the tall structures and short light-sensing structures, and wherein the collection of the measurable electrical quantities from each of the vignetted light sensors is responsive to the received incoming light field.

Example Visual Display Monitor Parameters

As an example of a visual display monitor, consider a visual display monitor as can be found in a home television viewing room or videoconferencing room:

1,000,000 pixels 1 mm pixel pitch

This implies such a monitor viewing area configurations of, for example:

a square monitor 1000 mm×1000 mm (3.3 feet×3.3 feet)

a 16:9 monitor of 1333 mm×750 mm (4.4 feet×2.5 feet)

Other arrangements are possible and provided for by the invention. For example, computer monitors often have yet other aspect ratios (such as 1024×1280 monitors having an aspect ratio of 4:5), NTSC video monitors have an aspect ratio of 3:4, etc. Yet other aspect rations (for example, as in smart phones, tablet computers, laptop computers, etc.) or sensor shapes can also be supported by the invention using the general schemes presented in the sections to follow.

In the example development and discussion to follow, the sensor array (or visual display monitor including the sensor array) is assumed flat and all sensors are assumed pointing perpendicularly outward from the surface of the screen. This case is of interest as most contemporary monitors are flat and this case also invokes limitations of the localization of vignette capture range overlap among sensors in the sensor array. However, other sensor orientation arrangements, for example curved arrangements, can improve the performance beyond that described herein. These are also provided for by the invention.

Optical Geometry Parameters and Variables

Figure 16:
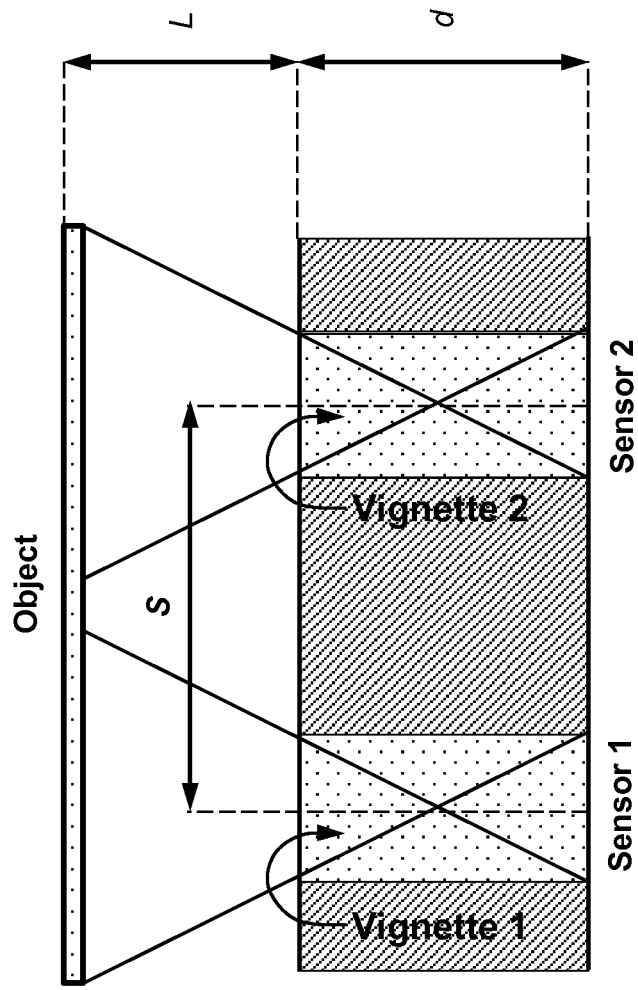
FIG. 16 depicts an optical ray-tracing model for a pair of example sensors, each provided with an associated vignetting structure, the vignetting structures aligned in parallel in a planar arrangement.

FIG. 16 depicts an optical ray-tracing model for a pair of example sensors, each provided with an associated vignetting structure, the vignetting structures aligned in parallel. Other arrangements can be used and this arrangement is merely by way of example and is not restrictive of the invention. In FIG. 16, the following physical length parameters are indicated:

| Variable | Description | Example |
|---|---|---|
| p | Sensor pixel size diameter/side | Example: p = 1 ("1 mm pitch") |
| d | Vignette depth | d = p, d = 4p, etc. |
| L | Separation of object from observing plane of planar vignetted light-sensor surface | |
| c | Sensor center (as indexed in an array) | Position/iterated over lattice |

| Variable | Description | Example |
|---|---|---|
| s | Separation between the ceneters of a pair of vignetted light-sensors | general cases, including far extremes of an array |

For these, all variables in common linear units of measure units (for example, mm).

To begin, consideration is given to the light-field capture range as a function of distance L for a vignetted light sensor of the type discussed in conjunction with FIG. 12, fabricated so that the sides of the vignetting structure cavity do not reflect light, with no shift in index of refraction, and further having a vignetted pixel-width p and vignette depth d. The calculations to follow can be adjusted for other cases.

As depicted in FIG. 12, the extreme-range light rays cross midway up the light-travel depth of the vignetting structure. Thus, for the purposes of light ray length calculations, as to be used in 'similar-triangle' geometry, the extremal light rays defining the span of light capture from the vignetted light sensor, effectively begin at a depth d/2 beneath the opening of the vignette, where d is the depth of the vignetting structure (more precisely, the distance between the surface of the light sensor and the opening at the opposite end of the vignetting structure.

Figure 17:
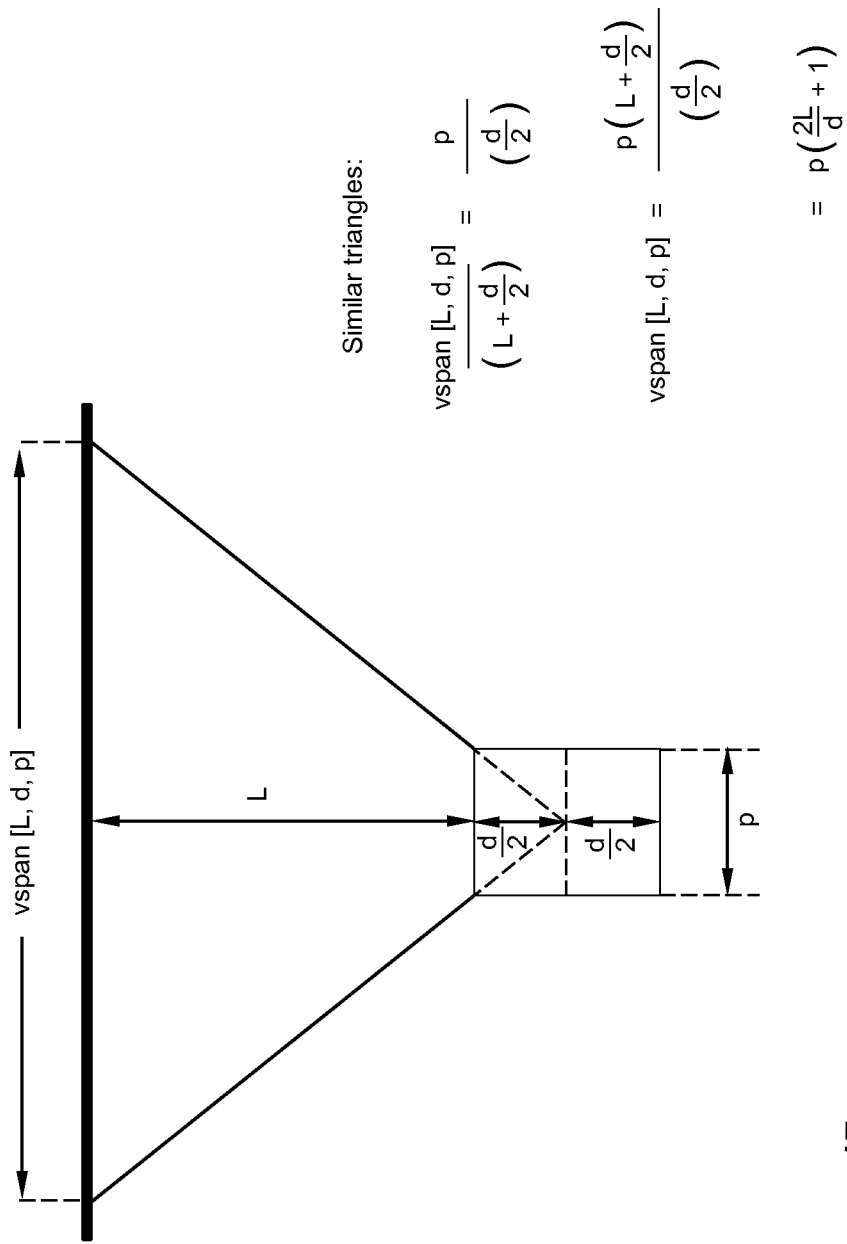
FIG. 17 depicts paths of the extremal light rays defining the span of light capture from the vignetted sensor, as in FIG. 12, but with dimensions added and an observed planar object located a distance L from the surface of the vignetted light sensor.

FIG. 17 depicts the paths of the extremal light rays defining the span of light capture from the vignetted sensor, as in FIG. 12, but with dimensions added and an observed planar object located a distance L from the surface of the vignetted light sensor. The span of light capture from the vignetted light sensor will be a function of d, p, and L; for convenience the function will be called The large isosceles triangle depicted in FIG. 17, comprising the top portion of length to be given by the function vspan[L,d,p] and comprising opposing vertex at a point halfway through the vignetting structure, is a similar triangle to the far smaller isosceles triangle with top edge of width p and depth d/2 that is wholly contained within the top half of the vignetting structure. The other two sides of the large isosceles triangle have length (L+d/2). As shown in the math provided in FIG. 17, the function vspan[L,d,p] can be solved for using the proportions determined by similar triangles, resulting in the expression $$vspan[L, d, p] = p\left(1 + \frac{2L}{d}\right)$$

Figure 18A:
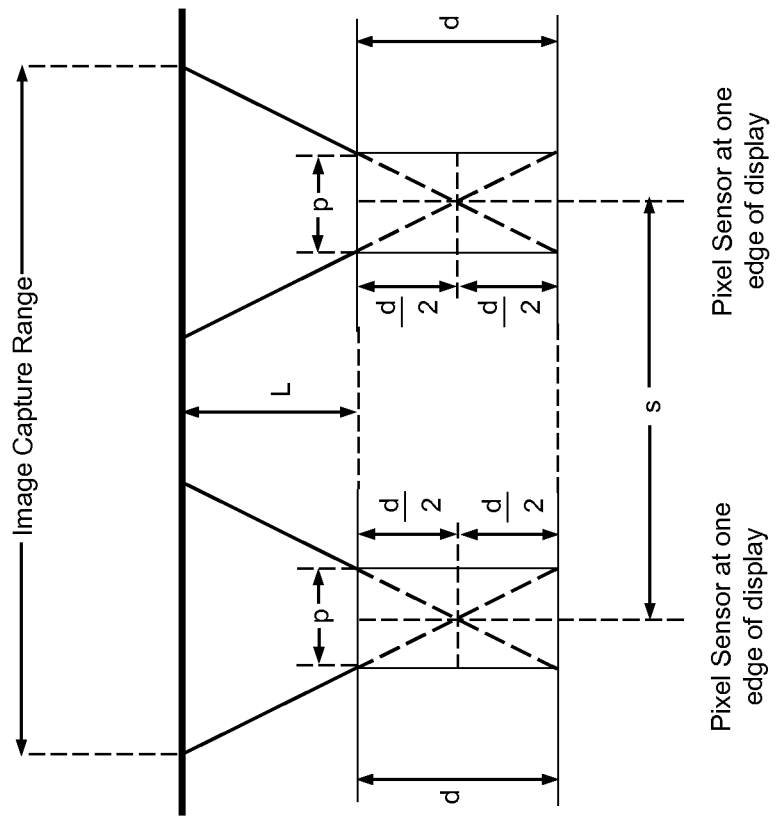
FIG. 18a depicts two vignetting structures side-by-side in the same plane with centers separated by the distance

Quantitatively developing the arrangement depicted in FIG. 16, FIG. 18*a* depicts two vignetting structures side-by-side in the same plane with centers separated by the distance s.

Figure 18B:
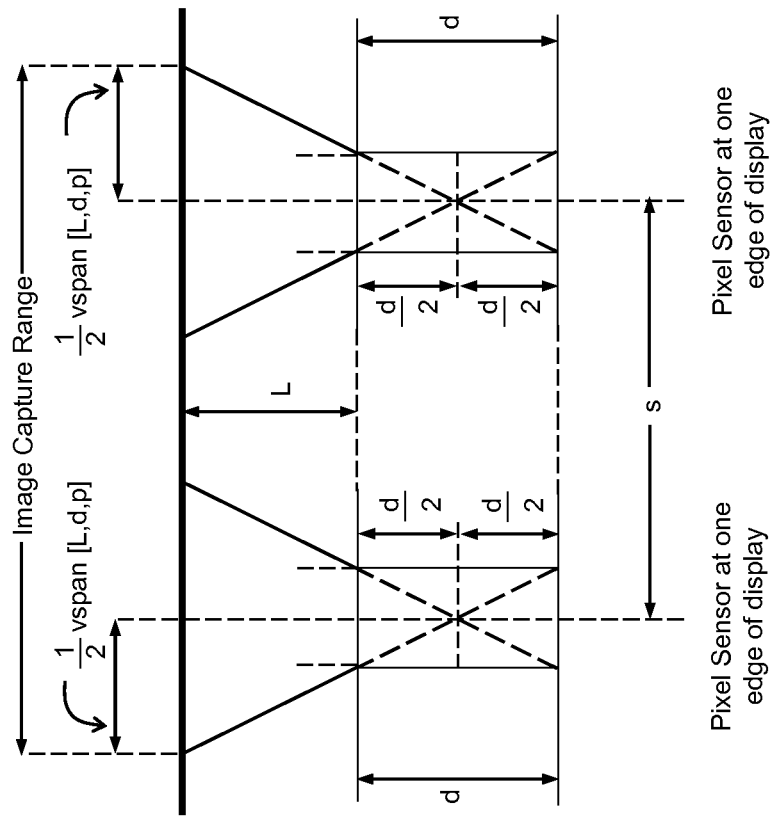
FIG. 18b depicts an application of the arrangement of FIG. 18a wherein the centerlines of each sensor are brought forward to intersect an observed object place a distance L from the sensor array plane.
Figure 19A:
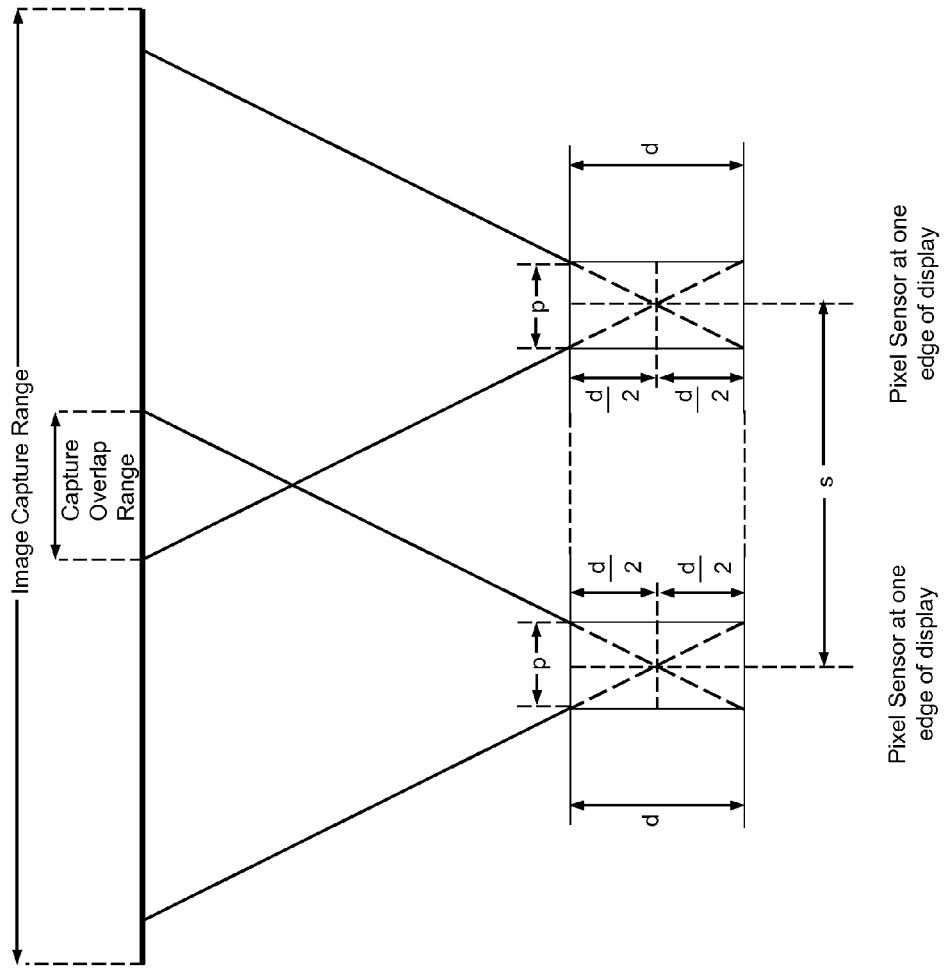
FIG. 19a depicts a variation on the arrangement depicted in FIG. 18a wherein the separation distance L between the sensor plane and the object is large enough that the vignetted sensor capture ranges overlap.
Figure 19B:
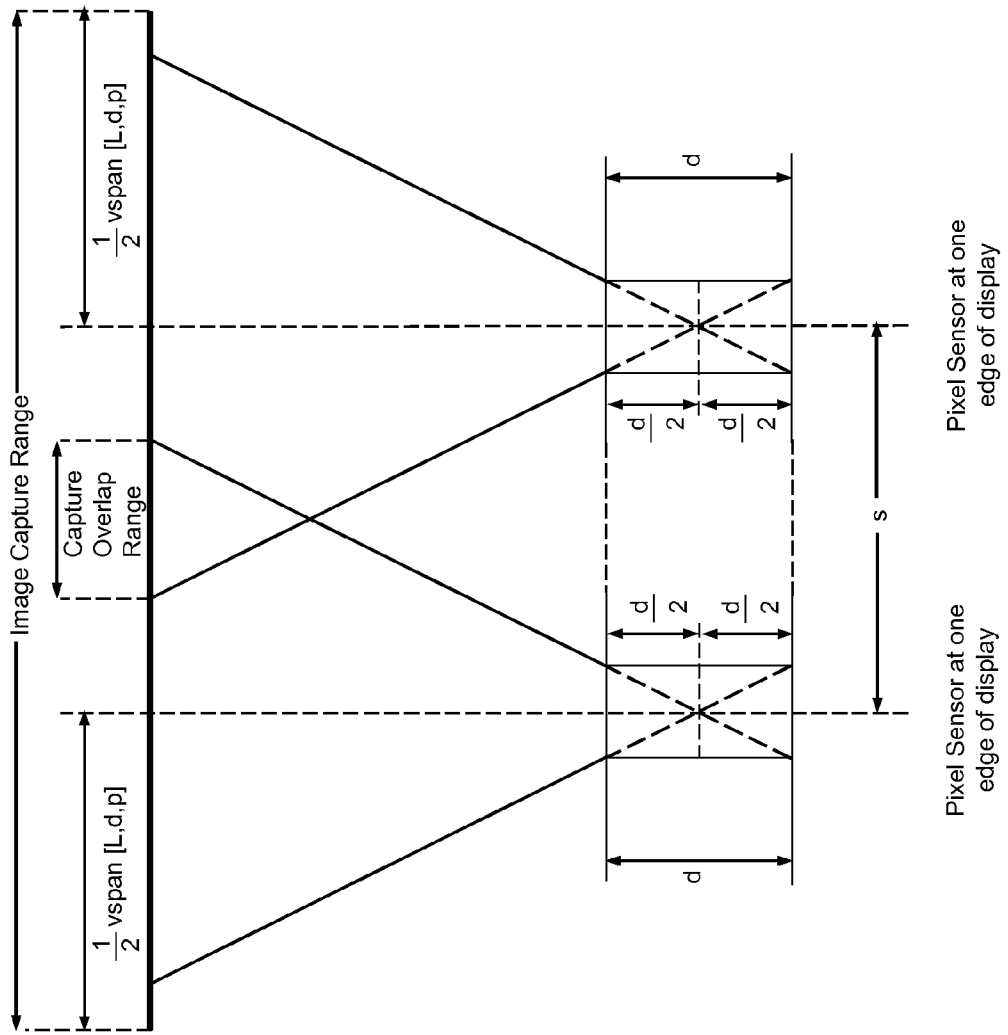
FIG. 19b depicts a variation on the arrangement depicted in FIG. 18b wherein the separation distance L between the sensor plane and the object is large enough that the vignetted sensor capture ranges overlap.
Figure 19C:
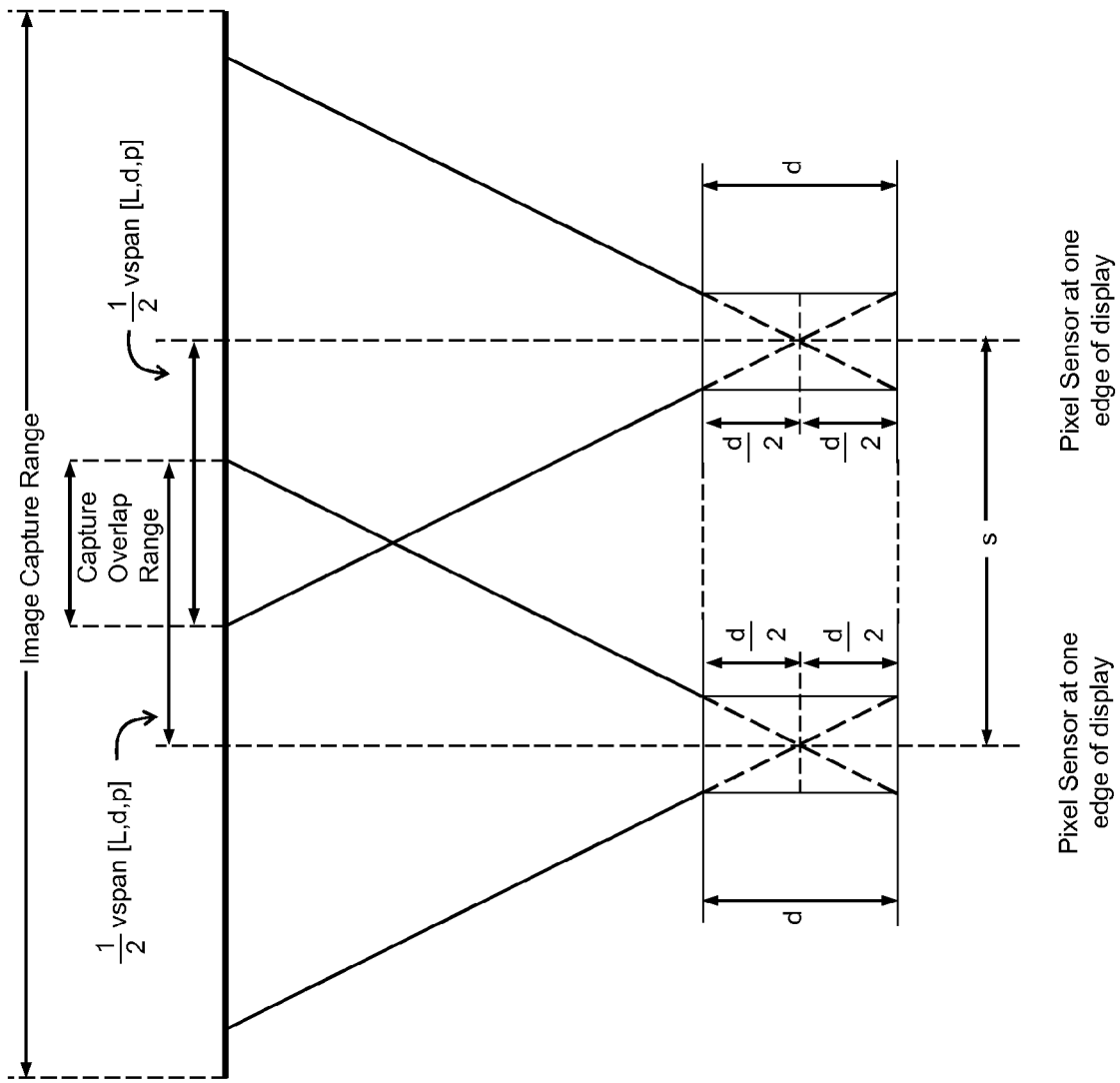
FIG. 19c depicts a quantification of the capture overlap range. Here the overlap occurs within the region in parallel projection to the sensor separations, the sensor centers separated by distance s.

It is noted that in FIGS. 18*a*-18*b* the separation distance between the sensor plane an the object plane is small enough that there is no overlap in the capture vignettes of two widely-spaced sensors. FIGS. 19*a*-19*c*, to be considered in detail shortly, provide a related development for cases where the separation distance between the sensor plane and the object plane is large enough that there is overlap in the capture vignettes of two widely-spaced sensors.

Figure 20B:
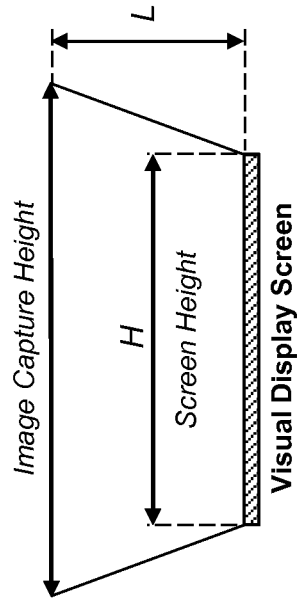
FIG. 20b depicts an optical ray-tracing model for relating the image capture height at a given distance L to the monitor height h.
Figure 20A:
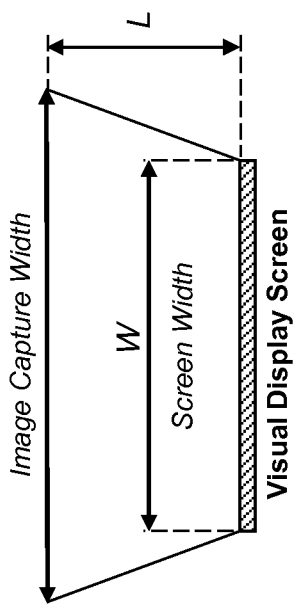
FIG. 20a depicts an optical ray-tracing model for relating the image capture width at a given distance L to the monitor width w.

Imaging Capture Region of the Width or Height of an LED Visual Display When Used as an Image Sensor FIG. 20*a* depicts an optical ray-tracing model for relating the image capture width at a given distance L to the monitor width w. FIG. 20b depicts an optical ray-tracing model for relating the image capture height at a given distance L to the monitor height h.

The optical ray tracing processes to be described below are identical for width or height. They can be generalized, then, by using the term "monitor dimension." Within this dimension, subportions will be called "regions"—for example the general term "image capture region" generalizes "image capture width" and "image capture height," and the general term "image overlap region" generalizes "image overlap width" and "image overlap height."

FIG. 18b depicts an application of the arrangement of FIG. 18a wherein the centerlines of each sensor are brought forward to intersect an observed object place a distance L from the sensor array plane. The image capture range of each vignetted sensor extends a distance of ½ vspan[L,d,p] to the left or right of its centerline. The image capture range spanned by an array of sensors whose edge sensors are separated by a distance s (between the edge sensor centerlines) would be given by ½ vspan[L,d,p]+s+½ vspan[L,d,p].

which simplifies to s+½ vspan[L,d,p], or $$s + p\left(1 + \frac{2L}{d}\right).$$

Thus for a monitor dimension (width or height) of size s, the image capture region size is given by $$s + p\left(1 + \frac{2L}{d}\right)$$

Figure 21:
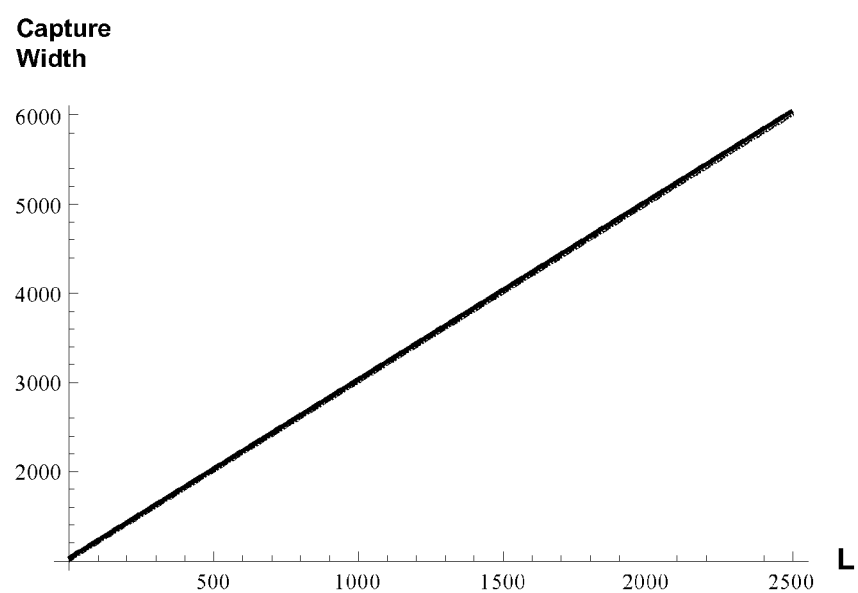
FIG. 21 is a plot of the variation in capture region (in lengths of mm) for arrangements such as those depicted in FIGS. 20a-20b, the capture region as a function of L for an example vignette depth of d=1 (1 mm).
Figure 22:
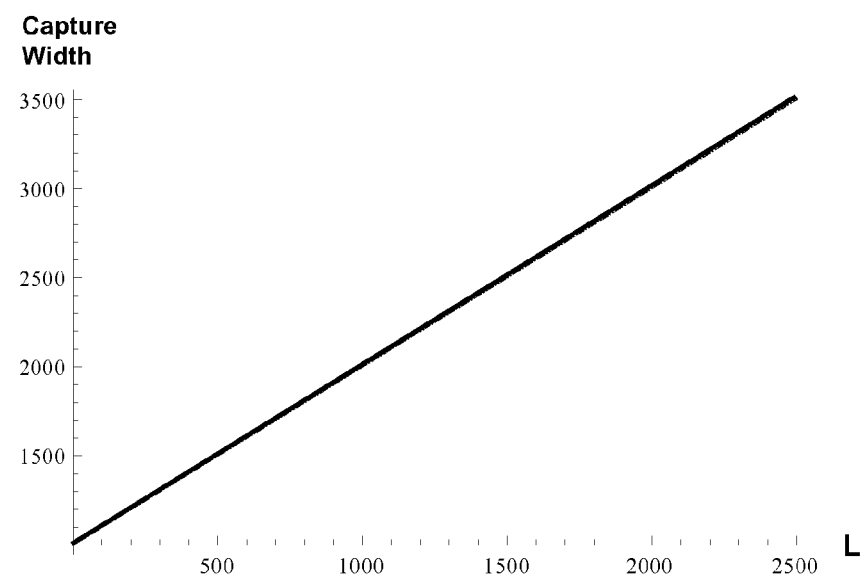
FIG. 22 is a plot of the variation in capture region (in lengths of mm) for arrangements such as those depicted in FIGS. 20a-20b, the capture region as a function of L for an example vignette depth of d=2 (2 mm).

Thus image capture region will be linear in the separation distance L between the sensor plane and the object. As examples, the variation in capture region (in lengths of mm) as a function of L is shown in the plot of FIG. 21 for an example vignette depth of d=1 (1 mm) and in the plot of FIG. 22 for an example vignette depth of d=2 (2 mm).

Figure 23:
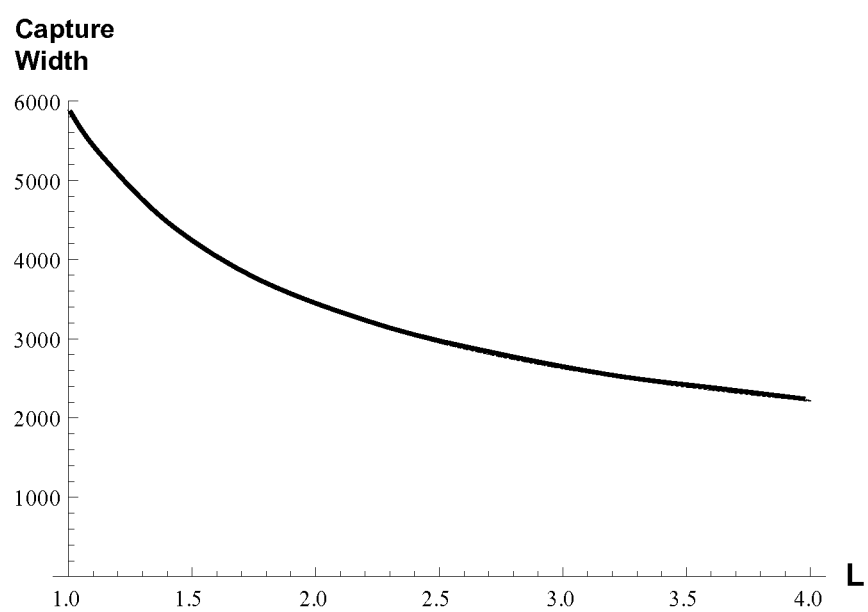
FIG. 23 is a plot showing the image capture region (in mm) varies in near inverse proportion to the vignette depth d for the case of L=2440 (8 feet) for arrangements such as those depicted in FIGS. 20a-20b.

Note that he image capture region is in near inverse proportion to the vignette depth d; for example, with L=2440 mm (8 feet) the capture region (in lengths of mm) varies as shown in the plot of FIG. 23.

As examples for a 1000 mm wide (3.3 feet) visual display screen:

For vignette depth d=1 the capture region at 8 feet is 5880 mm (19.3 feet wide)
For vignette depth d=2 the capture region at 8 feet is 3440 mm (11.3 feet wide)
For vignette depth d=3 the capture region at 8 feet is 2630 mm (8.6 feet wide)
For vignette depth d=4 the capture region at 8 feet is 2220 mm (7.3 feet wide)
For vignette depth d=5 the capture region at 8 feet is 1980 mm (6.5 feet wide)

As examples for a 1333 mm wide (4.4 feet) visual display screen:

For vignette depth d=1 the capture region at 8 feet is 6220 mm (20.4 feet wide)
For vignette depth d=2 the capture region at 8 feet is 3780 mm (12.4 feet wide)
For vignette depth d=3 the capture region at 8 feet is 2960 mm (9.7 feet wide)
For vignette depth d=4 the capture region at 8 feet is 2560 mm (8.4 feet wide)
For vignette depth d=5 the capture region at 8 feet is 2310 mm (7.6 feet wide)

As a typical living room couch seating area is roughly 8 feet wide, this suggests:

The likely deepest vignetting structure for use with a 1000 mm to 1333 mm wide visual display screen is d=4 (so as to avoid too narrow a capture region);
The likely shallowest vignetting structure for use with a 1000 mm to 1333 mm wide visual display screen is d=2 (so as to avoid too wide a capture region).

This range of vignetting structure depth is fortuitous as a vignetting structure that is deeper that ~4 times the pixel width can become somewhat difficult to fabricate with precision. Recall, however, that the Snell's Law ray bending approach described earlier can be used to create optical equivalents to deep vignette cavities.

Sensor Vignette Overlap

FIG. 19a depicts a variation on the arrangement depicted in FIG. 18a wherein the separation distance L between the sensor plane and the object is large enough that the vignetted sensor capture ranges overlap.

FIG. 19b depicts a variation on the arrangement depicted in FIG. 18b wherein the separation distance L between the sensor plane and the object is large enough that the vignetted sensor capture ranges overlap. Here the geometry and math is the same as for the arrangement depicted in FIG. 18b, so the image capture range is the same, namely given by ½ vspan[L,d,p]+s+½ vspan[L,d,p].

which simplifies to s+½ vspan[L,d,p], or $$s + p\left(1 + \frac{2L}{d}\right).$$

Of course this quantity is equal to $$p\left(1 + \frac{2L}{d}\right) + s,$$

this form of the expression to be appreciated in a moment

FIG. 19c depicts a quantification of the capture overlap range. Here the overlap occurs within the region in parallel projection to the sensor separations, the sensor centers separated by distance s. Note that if L were smaller and in fact a value for the given values of d and p such that s=vspan[L,d,p], then the sum ½ vspan[L,d,p]+½ vspan[L,d,p].

would be equal to s and there would be no overlap. In fact the overlap is the amount by which the sum ½ vspan[L,d,p]+½ vspan[L,d,p].

exceeds the value of s. Therefore capture overlap range is given by

½ vspan[L,d,p]+½ vspan[L,d,p]−s which simplifies to vspan[L,d,p]−s

Therefore, if L is large enough for there to be a capture overlap, the size of the capture overlap range is given by $$p\left(1+\frac{2L}{d}\right)-s,$$

The value $L^*$ at which all larger values of $L$ result in a capture overlap occurs when $s = \text{vspan}[L,d,p]$, requiring $$p\left(1+\frac{2L^*}{d}\right) = s$$

so that $$\left(1+\frac{2L^*}{d}\right) = \frac{s}{p}$$

and $$\frac{2L^*}{d} = \left(\frac{s}{p}-1\right)$$

giving $$L^* = \frac{d}{2}\left(\frac{s}{p}-1\right),$$

and thus for values of $L > L^*$ there will be capture overlap. Again note that if $L = L^*$ then $$p\left(1+\frac{2L}{d}\right) = s$$

so that the value of capture overlap range is $$p\left(1+\frac{2L}{d}\right) - s = s - s = 0.$$

Additionally note that if $L < L^*$ then the expression for the capture overlap range $$p\left(1+\frac{2L}{d}\right) - s,$$

Is negative; this fact will be used below in a moment.

Since at a distance $L$ the capture overlap range is given by $$p\left(1+\frac{2L}{d}\right) - s$$

and the image capture range is given by $$p\left(1+\frac{2L}{d}\right) + s$$

then the %-overlap (for case where $L > L^*$) is given by $$\frac{p\left(1+\frac{2L}{d}\right) - s}{p\left(1+\frac{2L}{d}\right) + s}.$$

Since $$p\left(1+\frac{2L}{d}\right) + s$$

is always positive, the ratio expression for the %-overlap is only negative for cases where $L < L^*$. Thus, for all values of $L$ (that is, all values with $L > 0$), the general expression for the %-overlap is given by $$\text{Max}\left[0, \frac{p\left(1+\frac{2L}{d}\right) - s}{p\left(1+\frac{2L}{d}\right) + s}\right].$$

Again, throughout the above, the sensor array is assumed flat and all sensors are assumed pointing perpendicularly outward from the surface of the array. As noted earlier, other sensor orientation arrangements can improve the performance beyond that described above.

Use in Design

The structures and their performance characterizations and tradeoffs as described thus far can be used to create various engineering designs for image capture. Some of many examples include:

From a provided pixel width p (corresponding to "pitch" and resolution on a display), a given desired range of separation distances $L_{min}, > L > L_{max}$, and a given screen size (determining the largest value for s), associated vignette depths d and % overlaps can be calculated. The % overlap can be then used in spatial sub-sampling design using approaches such as those described in the section to follow (as well as other spatial sub-sampling design approaches).

From a provided pixel width p (corresponding to "pitch" and resolution on a display), a given screen size (determining the largest value for s), and a practical range of inexpensively and reliably fabricated vignette depths $d_{min} > d > d_{max}$, a resulting range of separation distances $L_{min} > L > L_{max}$ and overlaps can be calculated. The % overlap can be then used in spatial sub-sampling design using approaches such as those described in the section to follow (as well as other spatial sub-sampling design approaches).

From a maximum permitted % overlap, and other values or ranges for some of the design parameters p, d, L, and s, values or ranges for the remaining design parameters can be calculated.

These are but a few of representative examples. In general, fixed values and/or ranges of values of some of the design parameters p, d, L, and s, as well as other derived quantities such as % overlap and spatial sub-sampling design parameters (for example, as described below), can be used to determine fixed values and/or ranges of values of the remaining design parameters and other derived quantities.

In design situations where ranges of values of some of the design parameters p, d, L, and s, as well as other derived quantities such as % overlap and spatial sub-sampling design parameters are provided, ranges of values of the remaining design parameters and other derived quantities can be obtained employing formal Interval Analysis methods for calculation and optimization, for example as taught in the books:

*Introduction To Interval Analysis* by Ramon E. Moore, R. Baker Kearfott, and Michael J. Cloud, ISBN 0898716696, published 1998-2008 by the Society For Industrial And Applied Mathematics (SIAM), Philadelphia;

*Methods And Applications Of Interval Analysis* by Ramon E. Moore, ISBN 0898711614, published in 1979 by the Society For Industrial and Applied Mathematics, Philadelphia;

*Applied Interval Analysis* by Luc Jaulin, Michel Kieffer, Olivier Didrit, and Eric Walter, ISBN 1852332190, published 2001 by Springer, London;

*Global Optimization Using Interval Analysis: Revised and Expanded* by Eldon Hansen, ISBN 0824740599, published in 2003 by Marcel Dekker/CRC Press.

Synthetic Imaging Computation Considerations

Continuing, the nearly full-overlap case, various image acquisition resolutions can be employed as can be advantageous or appropriate to various applications. Here some very broad-brush brute-force initial calculations are sketched:

For a case where 1000×1000 pixel resolution is desired: on the order of 1000×1000=1,000,000 linear calculations will be performed (using geometric and sparse-matrix techniques in a 4-D tensor structure) comprising linear operations involving sums and differences of on the order of 1,000,000 numbers. Sums of 1,000,000 binary numbers require up to Log 2(1,000,000)=20 bits. Then:

Use of 32-bit arithmetic leaves 12 bits to accommodate both sensor-value dynamic range and the impact of quantization noise (possibly not enough).

Use of 48-bit arithmetic leaves 28 bits to accommodate both sensor-value dynamic range and the impact of quantization noise.

Use of 64-bit arithmetic leaves 44 bits to accommodate both sensor-value dynamic range and the impact of quantization noise.

In rough terms, a worse-case quantization noise could consume up to another 20 bits. This initially suggests that 48-bit arithmetic would provide up to 8 bits of dynamic range if numerical operations are performed cleanly.

For a case where 500×500 pixel resolution is desired: on the order of 500×500=250,000 linear calculations will be performed (using geometric and sparse-matrix techniques in a 4-D tensor structure) comprising linear operations involving sums and differences of on the order of 250,000 numbers. Sums of 250,000 binary numbers require up to $\text{Log}_2(250,000)$=18 bits. In bold terms, one could expect worse-case quantization noise to consume up to another 18 bits. Thus, the 500×500 pixel resolution case is not appreciably different from the number of bits required (basically ~4 bits), although now as much as 12 bits of combined dynamic range and noise margin could be accommodated.

However, these extremes are not actually required as a staggered spatial decimation (sub-sampling) technique can dramatically reduce the number of measurement values involved in the aforementioned linear operation sums and differences.

Staggered Spatial Sub-Sampling

The invention provides for staggered spatial decimation (sub-sampling) to be used to reduce the number of measurement values involved in image formation calculations.

For each output pixel, the wide degree of vignette overlap implies that the immediate vignetted sensor neighbors of any given vignetted sensor measures practically the same light flux as the given vignetted sensor itself. Under these conditions, the number of measurement values involving in the calculation of the value of a specified output pixel can be reduced by only incorporating the measurement values for every $N^{th}$ sensor in the index directions surrounding it.

For example, if N=2 a thinned collection of sensor values could be for example those in the sequence:

$\{1,1\},\{1,3\},\{3,1\},\{3,3\},\{3,5\},\{5,3\},\{5,5\},\ldots$ or the sequence $\{2,2\},\{2,4\},\{4,2\},\{4,4\},\{4,6\},\{6,4\},\{6,6\},\ldots$ As another example, if N=3 a thinned collection of sensor values could be for example those in the sequence:

$\{1,1\},\{1,4\},\{4,1\},\{4,4\},\{4,7\},\{7,4\},\{7,7\},\ldots$ or the sequence $\{2,2\},\{2,5\},\{5,2\},\{5,5\},\{5,8\},\{8,5\},\{8,8\},\ldots$ or the sequence $\{3,3\},\{3,6\},\{6,3\},\{6,6\},\{6,9\},\{9,6\},\{9,9\},\ldots$ Then for the next adjacent output pixel in a particular index direction, the indices of the thinned collection used in the previous output pixel would be shifted by 1 for that index. Thus the spatial resolution of the synthetically-formed image is not affected by this staggered spatial decimation (sub-sampling) employed in reducing the complexity of the value calculation of each individual output pixel.

Accordingly, the real-time computational load scales linearly with the number of pixels of resolution of the captured image (maximum resolution bounded by the number of sensors in the sensor array).

Impact of Staggered Spatial Sub-Sampling on Synthetic Imaging Computation Considerations For example, with a 1/10—rate staggered spatial sub-sampling, the number of measurement values involved in the aforementioned linear operation sums and differences will drop by a factor of 10×10=100. The staggered spatial sub-sampling is robustly supported for at least a 1/10—rate since the vignette overlap (i.e., roughly on the order of 1000 pixels) is so significant. As examples of the impact:

For 1/11—rate staggered spatial sub-sampling, the number of measurement values involved in the aforementioned linear operation sums and differences will drop by a factor of 11×11=121, representing a savings of 7 bits. Allowing then 20−7=13 bits plus another 13 bits for quantization noise, use of 32-bit arithmetic leaves 32−26=6 bits of dynamic range.

For 1/16—rate staggered spatial sub-sampling, the number of measurement values involved in the aforementioned linear operation sums and differences will drop by a factor of 16×16=256, representing a savings of 8 bits. Allowing then 20−8=12 bits plus another 12 bits for quantization noise, use of 32-bit arithmetic leaves 32−24=8 bits of dynamic range.

For 1/64—rate staggered spatial sub-sampling, the number of measurement values involved in the aforementioned linear operation sums and differences will drop by a factor of 32×32=1024, representing a savings of 8 bits. Allowing then 20−8=12 bits plus another 12 bits for quantization noise, use of 32-bit arithmetic leaves 32−24=8 bits of dynamic range.

Because the vignette overlap for a screen-to-object separation distance of 8 feet is so significant (i.e., roughly on the order of 1000 pixels), in many applications a 1/64—rate staggered sub-sampling (if not sparser rate staggered sub-sampling) would be robustly supported.

Example Design Considerations and Conclusions

For meaningful use the intrinsic optics and geometry invoke nearly a full overlap of the vignettes at an 8 foot (2440 mm) separation distance from the screen. As a result:

- The resolution is therefore defined by the computational and measurement noise floor;
- The real-time computation can work with a considerably large degree of staggered spatial sub-sampling, dramatically reducing the number of linear operations required of the real-time processor;
- Such staggered spatial sub-sampling can be used to greatly reduce the impact of computation-imposed quantization noise and hence the noise floor that defines the viable resolution of the system;
- The real-time computational load scales linearly with the number of pixels of resolution of the captured image (maximum resolution bounded by the number of sensors in the sensor array).

As an example outcome, using a vignetting structure equivalent to an optical depth of 2 mm to 4 mm deep (fabricated for example using printed materials) in a visual display monitor comprising 1,000,000 pixels of 1 mm pitch, calculations show 32-bit arithmetic could support imaging of arbitrary resolution, including as high as the full resolution of the display (1000×1000 or 1333×750).

Interactive Visualization and Mathematical Analysis Software

The invention provides for the implementations of interactive visualization and mathematical analysis software tool for performing the optical aspects of the above and related types of analysis.

The examples below are depicted in Mathematica™. Other computing languages or modeling environments (such as C, C++, Java, Java++, MatLab™, Macsyma™, etc.) could be used, and many additional features can be added.

Imaging Visualization Graphics Objects

An example of a parameterized visual graphics rendering of a sensor vignette structure is:

```
sensor[c, L, d, p] = Graphics[{
    LightBlue, Rectangle[{0, c – p/2}, {d, c + p/2}]},
    Line[{{0, c – p/2}, {d + L, c – p/2 + (p/d) (d + L)}}],
    Line[{{0, c + p/2}, {d + L, c + p/2 – (p/d) (d + L)}}]
}]
```

The output is a parameterized visual graphics rendering of a sensor vignette structure (of the specified depth d and sensor center-location c) together with the envelope of the resulting light-capture vignette (extending to the specified screen-to-object separation distance L).

An example of a parameterized visual graphics rendering of an associated object plane is:

```
object[c, L, d, p] = Graphics[{
    Green, Line[{{d + L, –c + p/2 – (p/d) (d + L)}, {d + L, c – p/2 + (p/d) (d + L)}}]
}]
```

The output is a parameterized visual graphics rendering of a parallel object plane (located at specified screen-to-object separation distance L) aligned & scaled along with the above sensor. Each sensor can render its own object plane, and a linear array of sensors creates a merged object plane.

Imaging Ray-Tracing Functions

An example of a function representing the light-sensing geometric span provided by the vignette arrangement of each sensor is:

$$\text{vignettespan}[c,L,d,p] = \{c+p/2-(p/d)(d+L), c-p/2+(p/d)(d+L)\}$$

Here, c is the center of the sensor in one-dimention of a sensor array. The output is a list of the extreme values of the light sensing envelope. The most positive value is the first element $$\text{vignettespan}[c,L,d,p][[1]]$$

and the most negative value is the second element $$\text{vignettespan}[c,L,d,p][[2]].$$

These are used in the two functions to follow.

An example of a function representing the overlap between the span of two given sensors separated by a distance of 2c is:

```
overlap[c, L, d, p] = Max[0, (vignettespan[–c, L, d, p][[2]] –
                                vignettespan[c, L, d, p][[1]]) /
    (vignettespan[c, L, d, p][[2]] – vignettespan
    [c, L, d, p][[1]])]
```

The output is a scalar representing the spatial overlap of the light sensing envelope of two sensors symmetrically spaced either side of a central reference position. Here the scale of the spacing is used to represent the spacing of adjacent sensors.

An example of a function representing the image capture region for two given sensors separated by a distance of 2c is:

$$\text{captureregion}[c,L,d,p] = \text{vignettespan}[c,L,d,p][[2]] - \text{vignettespan}[-c,L,d,p][[1]]$$

As an example, the quantity c can be set to a value of s/2, corresponding to a sensor separation distance of s (i.e., s=2c).

The output is a scalar representing the region of the overall image sensing envelope of two sensors symmetrically spaced either side of a central reference position. Here the scale of the spacing is used to represent the region of the entire sensor array; since centers are at +c and –c, wherein the value of c is set equal to s/2, corresponding to a sensor separation distance of s (i.e., s=2c).

The described techniques can be implemented as a method, apparatus or article of manufacture involving software, firmware, micro-code, hardware such as logic, memory and/or any combination thereof. The term "article of manufacture" as used herein refers to code or logic and memory implemented in a medium, where such medium can include hardware logic and memory [e.g., an integrated circuit chip, Programmable Gate Array (PGA), Application Specific Integrated Circuit (ASIC), etc.] or a computer readable medium, such as magnetic storage medium (e.g., hard disk drives, floppy disks, tape, etc.), optical storage (CDROMs, optical disks, etc.), volatile and non-volatile memory devices [e.g., Electrically Erasable Programmable Read Only Memory (EEPROM), Read Only Memory (ROM), Programmable Read Only Memory (PROM), Random Access Memory (RAM), Dynamic Random Access Memory (DRAM), Static Random Access Memory (SRAM), flash, firmware, programmable logic, etc.].

Code in the computer readable medium is accessed and executed by a processor. The medium in which the code or logic is encoded can also include transmission signals propagating through space or a transmission media, such as an optical fiber, copper wire, etc. The transmission signal in which the code or logic is encoded can further include a wireless signal, satellite transmission, radio waves, infrared signals, Bluetooth, the internet etc. The transmission signal in which the code or logic is encoded is capable of being transmitted by a transmitting station and received by a receiving station, where the code or logic encoded in the transmission signal can be decoded and stored in hardware or a computer readable medium at the receiving and transmitting stations or devices.

CLOSING

Additionally, the "article of manufacture" can include a combination of hardware and software components in which the code is embodied, processed, and executed. Of course, those skilled in the art will recognize that many modifications may be made without departing from the scope of embodiments, and that the article of manufacture may include any information bearing medium. For example, the article of manufacture includes a storage medium having stored therein instructions that when executed by a machine results in operations being performed.

Certain embodiments can take the form of an entirely hardware embodiment, an entirely software embodiment or an embodiment containing both hardware and software elements. One embodiment, may be implemented in software, which includes but is not limited to firmware, resident software, microcode, etc. Elements that are in communication with each other need not be in continuous communication with each other, unless expressly specified otherwise. In addition, elements that are in communication with each other may communicate directly or indirectly through one or more intermediaries. Additionally, a description of an embodiment with several components in communication with each other does not imply that all such components are required. On the contrary, a variety of optional components are described to illustrate the wide variety of possible embodiments.

Further, although processes and methods may be described in a sequential order, such processes, methods and algorithms may be configured to work in alternate orders. In other words, any sequence or order of blocks that may be described does not necessarily indicate a requirement that the blocks be performed in that order. The processes described herein may be performed in any order practical. Further, some processes may be performed simultaneously, in parallel, or concurrently. Further, some or all processes may be performed in run-time mode.

The terms "certain embodiments", "an embodiment", "embodiment", "embodiments", "the embodiment", "the embodiments", "one or more embodiments", "some embodiments", and "one embodiment" mean one or more (but not all) embodiments unless expressly specified otherwise. The terms "including", "comprising", "having" and variations thereof mean "including but not limited to", unless expressly specified otherwise. The enumerated listing of items does not imply that any or all of the items are mutually exclusive, unless expressly specified otherwise. The terms "a", "an" and "the" mean "one or more", unless expressly specified otherwise.

Computer program means or computer program in the present context mean any expression, in any language, code or notation, of a set of instructions intended to cause a system having an information processing capability to perform a particular function either directly or after either or both of the following a) conversion to another language, code or notation; b) reproduction in a different material form.

Although example embodiments have been provided in detail, it should be understood that various changes, substitutions and alternations could be made thereto without departing from spirit and scope of the disclosed subject matter as defined by the appended claims. Variations described for example embodiments may be realized in any combination desirable for each particular application. Thus particular limitations, and/or embodiment enhancements described herein, which may have particular advantages to a particular application, need not be used for all applications. Also, not all limitations need be implemented in methods, systems, and/or apparatuses including one or more concepts described with relation to the provided example embodiments.

While the invention has been described in detail with reference to disclosed embodiments, various modifications within the scope of the invention will be apparent to those of ordinary skill in this technological field. It is to be appreciated that features described with respect to one embodiment typically can be applied to other embodiments.

The invention can be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein. Therefore, the invention properly is to be construed with reference to the claims.

The invention claimed is:

1. A method for implementing light field sensor for use in lensless synthetic imaging, the method comprising:
   Fabricating relatively tall structures and short structures, wherein the short structures comprise light sensing capabilities, and wherein the tall structures and short structures are arranged in an array to create an array comprising a plurality of vignetted light sensors, and
   Receiving an incoming light field,
   Partitioning the incoming light field with the tall structures to created a plurality of vignetted light fields, each vignetted light field uniquely associated with a particular vignetted light sensor from the plurality of vignetted light sensors,
   Receiving each vignetted light field at the associated each vignetted light sensor, and
   Generating, at each vignetted light sensor, a measurable electrical quantity responsive to the associated vignetted light field,
   Wherein the vignetted light sensors comprising a vignette depth resulting from the difference in height between the tall structures and short light-sensing structures, and
   Wherein the collection of the measurable electrical quantities from each of the vignetted light sensors is responsive to the received incoming light field, the plurality of vignetted light sensors thereby acting as light field sensor.

2. The method of claim 1 wherein the tall structures are configured to emit light.

3. The method of claim 1 wherein the tall structures comprise layers of materials.

4. The method of claim 1 wherein the short structures comprise layers of materials.

5. The method of claim 1 wherein the "tall" structures are light-emitting, and the array of "tall" structures collectively act as a light-emitting visual display further comprising an array of vignetted light sensors, each vignetted light sensor comprising at least one "short" structure.

6. The method of claim 5 wherein the "tall" structures comprise a light-emitting element that is responsive to electronic circuitry, the electronic circuitry configured for multiplexing operation.

7. The method of claim 1 wherein the "tall" structure does not emit light.

8. The method of claim 1 wherein the "tall" structure comprises one or more electronic device.

9. The method of claim 8 wherein the electronic device comprises a driver transistor.

10. The method of claim 8 wherein the electronic device comprises a sensor interface transistor.

11. The method of claim 8 wherein the electronic device comprises a multiplexing transistor.

12. The method of claim 1 wherein the "tall" structures form vignetting structures around the short structures.

13. The method of claim 11 wherein the vignetting structures are configured to reflect light.

14. The method of claim 11 wherein the vignetting structures are configured to not reflect light.

15. The method of claim 1 wherein vignetting structures internally comprise at least a first material with an index or refraction different from that of air.

16. The method of claim 14 further comprising at least a second material with an index or refraction different from that of the first material.

17. The method of claim 1 wherein each measurable electrical quantity comprises a photocurrent.

18. The method of claim 1 wherein each measurable electrical quantity comprises a photovoltage.

19. The method of claim 1 wherein each measurable electrical quantity comprises a photo-induced charge.

20. The method of claim 1 wherein the measurable electrical quantities are converted into electrical signals by electronic circuitry configured to operate as a multiplexed array.

* * * * *